United States Patent
Wong et al.

(10) Patent No.: US 11,282,560 B2
(45) Date of Patent: *Mar. 22, 2022

(54) TEMPERATURE-BASED ACCESS TIMING FOR A MEMORY DEVICE

(71) Applicant: Micron Technology, Inc., Boise, ID (US)

(72) Inventors: Victor Wong, Boise, ID (US); Sihong Kim, Boise, ID (US); Hiroshi Akamatsu, Boise, ID (US); Daniele Vimercati, El Dorado Hills, CA (US); John D. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/208,433

(22) Filed: Mar. 22, 2021

(65) Prior Publication Data

US 2021/0304806 A1    Sep. 30, 2021

Related U.S. Application Data

(63) Continuation of application No. 16/829,996, filed on Mar. 25, 2020, now Pat. No. 10,978,130.

(51) Int. Cl.
*G11C 7/04*    (2006.01)
*G11C 11/22*    (2006.01)

(52) U.S. Cl.
CPC ............ *G11C 11/2293* (2013.01); *G11C 7/04* (2013.01); *G11C 11/221* (2013.01); *G11C 11/2255* (2013.01); *G11C 11/2259* (2013.01); *G11C 11/2273* (2013.01)

(58) Field of Classification Search
CPC ............ G11C 11/2293; G11C 11/2255; G11C 11/2273; G11C 11/2259; G11C 11/221
See application file for complete search history.

(56) References Cited

U.S. PATENT DOCUMENTS

| | | | |
|---|---|---|---|
| 7,642,833 B1 * | 1/2010 | Smith | H03H 11/54 327/281 |
| 2006/0280239 A1 | 12/2006 | Moll et al. | |
| 2007/0091710 A1 * | 4/2007 | Oh | G11C 11/419 365/233.14 |
| 2010/0039851 A1 | 2/2010 | Morita et al. | |
| 2015/0300889 A1 | 10/2015 | Ramaraju et al. | |
| 2018/0149527 A1 | 5/2018 | Lu et al. | |

* cited by examiner

*Primary Examiner* — Uyen Smet
(74) *Attorney, Agent, or Firm* — Holland & Hart LLP

(57) ABSTRACT

Methods, systems, and devices for temperature-based access timing for a memory device are described. In some memory devices, accessing memory cells may be associated with different operations that are variously dependent on a temperature of the memory device. For example, some operations associated with accessing a memory cell may have a longer duration and others a shorter duration depending on the temperature of the memory device. In accordance with examples as disclosed herein, a memory device may be configured for performing some portions of an access operation according to a duration that is proportional to a temperature of the memory device, and performing other portions of the access operation according to a duration that is inversely proportional to a temperature of the memory device.

20 Claims, 10 Drawing Sheets

TEMPERATURE-BASED ACCESS TIMING FOR A MEMORY DEVICE

CROSS REFERENCE

The present Application for Patent is a continuation of and claims priority to and the benefit of U.S. patent application Ser. No. 16/829,996 by Wong et al., entitled "TEMPERATURE-BASED ACCESS TIMING FOR A MEMORY DEVICE," filed Mar. 25, 2020, assigned to the assignee hereof, and is expressly incorporated by reference in its entirety herein.

BACKGROUND

The following relates generally to one or more memory systems and more specifically to temperature-based access timing for a memory device.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
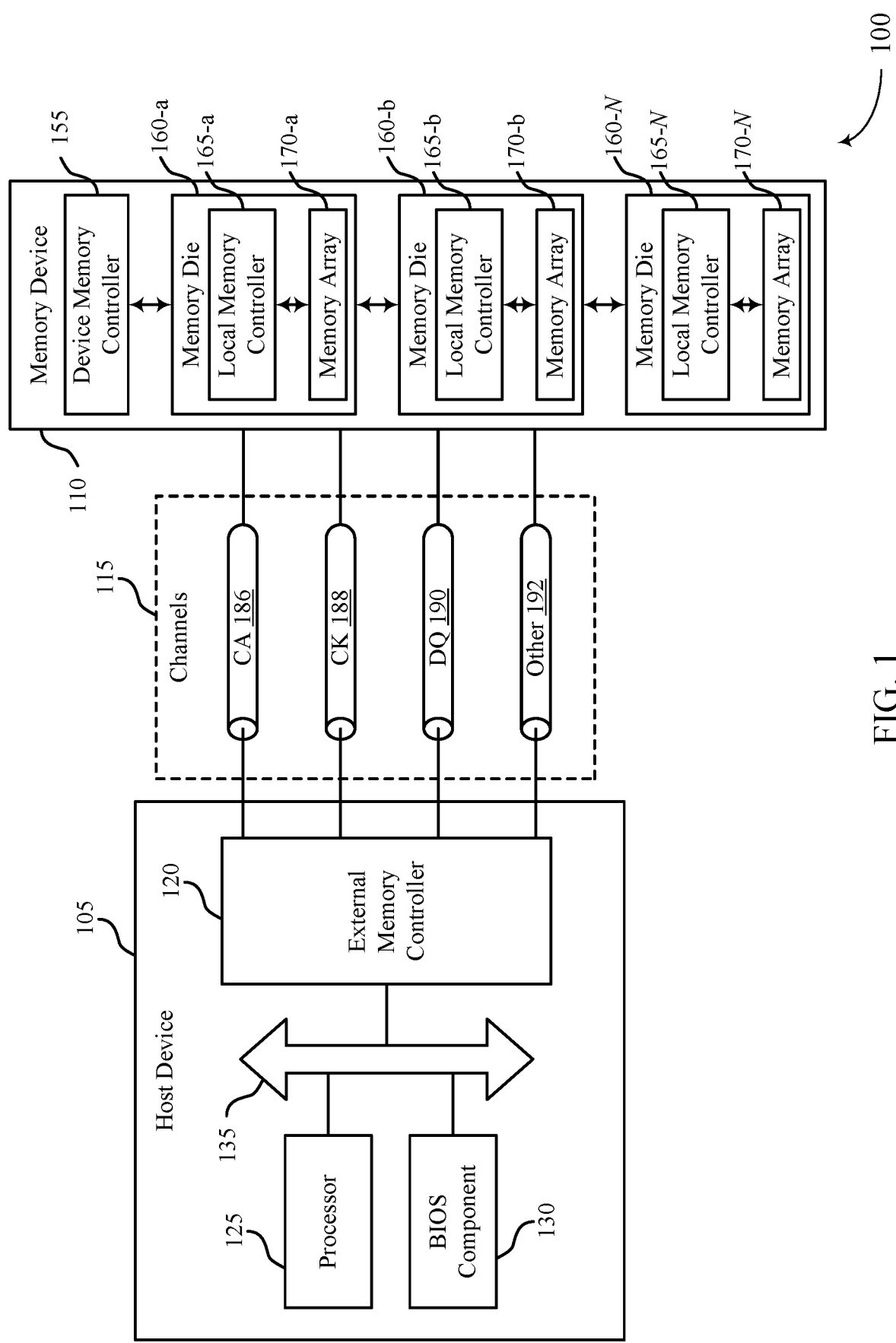
FIG. 1 illustrates an example of a system that supports temperature-based access timing for a memory device in accordance with examples as disclosed herein.

A memory system in accordance with examples as disclosed herein may include a memory device and a host device coupled with the memory device. A memory device may include an array of memory cells, each configured for storing an information state (e.g., logic state). Memory cells may leverage various phenomena for storing and reading an information state, and may include storage elements that store an information state in a corresponding physical state of a storage element, such as a charge state, a polarization state, a material state, a resistance state, a threshold state, and others. A memory device may also include various configurations of circuitry for accessing the memory cells (e.g., accessing the storage elements), which may be configured according to the type or types of storage elements included in the memory cells.

In some memory devices, accessing a memory cell may be associated with operations having characteristics are dependent on a temperature of the memory device. For example, some operations associated with accessing a memory cell may be associated with a longer duration or shorter duration depending on the temperature of the memory device. In some examples, durations of operations for accessing a memory cell may be related to physical phenomena of the memory cell itself. In some examples, durations of operations for accessing a memory cell may be related to physical phenomena of circuitry used to access the memory cell, or to evaluate signals generated from accessing the memory cell. In some cases, the physical phenomena of memory cells may be different than the physical phenomena of the associated access circuitry, which may lead to different temperature dependence between such components of a memory device.

In accordance with examples as disclosed herein, a memory device may be configured for performing some portions of an access operation according to a duration that is proportional (e.g., directly proportional) to a temperature of the memory device, or a duration that is otherwise relatively longer at relatively higher temperatures, and performing some portions of the access operation according to a duration that is inversely proportional to a temperature of the memory device, or a duration that is otherwise relatively shorter at relatively higher temperatures. Such techniques may be used to manage overall durations of access operations, reduce variability in access operations, improve read margins, reduce bit error rates (BER), or otherwise improve robustness to temperature variability, among other benefits.

Features of the disclosure are initially described in the context of memory systems and dies as described with reference to FIGS. 1 and 2. Features of the disclosure are described in the context of memory cell characteristics, and associated circuits and access operations, as described with reference to FIGS. 3-6. These and other features of the disclosure are further illustrated by and described with reference to an apparatus diagram and flowcharts that relate to temperature-based access timing for a memory device as described with reference to FIGS. 7-10.

FIG. 1 illustrates an example of a system 100 that supports temperature-based access timing for a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device. Each channel 115 may include one or more signal paths or transmission media (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any number of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

A memory array 170 may include memory cells that leverage various physical phenomena for storing and reading an information state. For example, memory cells may include a storage element that stores an information state in a corresponding physical state of the storage element, such as a charge state, a polarization state, a material state, a resistance state, a threshold state, and others. A memory die 160 (e.g., a memory array 170) may also include various configurations of circuitry for accessing the memory cells (e.g., accessing the storage elements), which may be configured according to the type or types of storage elements included in the memory cells. In some examples, accessing a memory cell may be associated with operations having characteristics that are dependent on a temperature of the memory device 110 (e.g., a temperature of a memory die 160, a temperature of a memory array 170). For example, some operations (e.g., sub-operations) associated with accessing a memory cell may have a characteristic duration that is relatively longer or relatively shorter depending on the temperature of the memory device 110.

In accordance with examples as disclosed herein, a memory device 110 may be configured for performing different portions of an access operation according to different dependence on temperature. For example, a memory device 110 (e.g., a device memory controller 155, a local memory controller 165) may be configured for performing some portions of an access operation according to a duration that is proportional (e.g., directly proportional) to a temperature of the memory device, or a duration that is otherwise relatively longer at relatively higher temperatures. The memory device 110 may also be configured for performing some portions of the access operation according to a duration that is inversely proportional to a temperature of the memory device, or a duration that is otherwise relatively shorter at relatively higher temperatures. Such techniques may be used in a memory device 110, or a system 100, to manage overall durations of access operations, reduce variability in access operations, improve read margins, reduce bit error rates (BER), or otherwise improve robustness to temperature variability, among other benefits.

Figure 2:
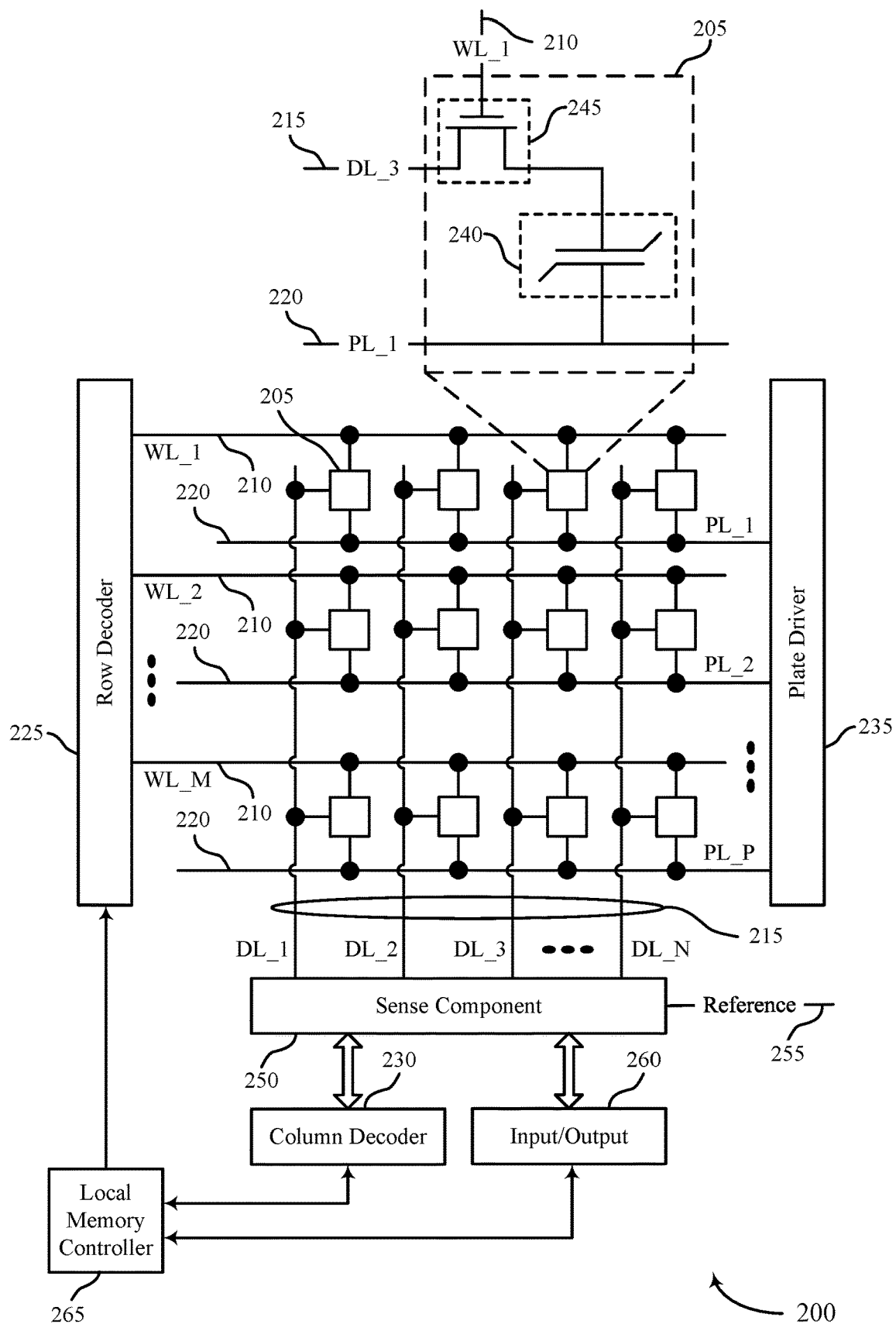
FIG. 2 illustrates an example of a memory die that supports temperature-based access timing for a memory device in accordance with examples as disclosed herein.

FIG. 2 illustrates an example of a memory die 200 that supports temperature-based access timing for a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1. In various examples, the memory cells 205 may include a capacitive storage element, a ferroelectric storage element, a material memory element, a resistive memory element, a thresholding memory element, a phase change memory element, or other types of storage elements.

In some examples, a memory cell 205 may store a state (e.g., a polarization state, a dielectric charge) representative of the programmable states in a capacitor (e.g., capacitor 240). In FeRAM architectures, the memory cell 205 may include a capacitor 240 that includes a ferroelectric material to store a charge and/or a polarization representative of the programmable state. In some examples, a memory cell 205 may include a logic storage component (e.g., capacitor 240) and a switching component 245. A first node of the logic storage component may be coupled with the switching component 245 and a second node of the logic storage component may be coupled with a plate line 220. The switching component 245 may be an example of a transistor or any other type of switch device that selectively establishes or de-establishes electronic communication between two components.

In some examples, a memory cell 205 may include or otherwise be associated with a configurable material, which may be referred to as a material memory element, a material storage element, a material portion, and others. The configurable material may have one or more variable and configurable characteristics or properties (e.g., material states) that are representative of (e.g., correspond to) different logic states. For example, a configurable material may take different forms, different atomic configurations, different degrees of crystallinity, different atomic distributions, or otherwise maintain different characteristics that may be leveraged to represent one logic state or another. In some examples, such characteristics may be associated with different electrical resistances, different threshold voltages, or other properties that are detectable or distinguishable during a read operation to identify a logic state written to or stored by the configurable material.

In some cases, a configurable material of a memory cell 205 may be associated with a threshold voltage. For example, electrical current may flow through the configurable material when a voltage greater than the threshold voltage is applied across the memory cell 205, and electrical current may not flow through the configurable material, or may flow through the configurable material at a rate below some level (e.g., according to a leakage rate), when a voltage less than the threshold voltage is applied across the memory cell 205. Thus, a voltage applied to memory cells 205 may result in different current flow, or different perceived resistance, or a change in resistance (e.g., a thresholding or switching event) depending on whether a configurable material portion of the memory cell 205 was written with one logic state or another. Accordingly, the magnitude of current, or other characteristic (e.g., thresholding behavior, resistance breakdown behavior, snapback behavior) associated with the current that results from applying a read voltage to the memory cell 205, may be used to determine a logic state written to or stored by memory cell 205.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 or other storage element may be isolated from digit line 215 when the switching component 245 is deactivated, and the capacitor 240 or other storage element may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor 240 or other storage element of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 or other storage element of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. In some examples, the plate line 220 may be in electronic communication with a node (e.g., the cell bottom) of a capacitor 240. The plate line 220 may cooperate with the digit line 215 to bias a capacitor 240 or other storage element during access operation of the memory cell 205.

The sense component 250 may determine a state (e.g., a polarization state or a charge) stored on the capacitor 240 or other storage element of the memory cell 205 and determine a logic state of the memory cell 205 based on the detected state. The sense component 250 may include one or more sense amplifiers to amplify the signal output of the memory cell 205. In some examples, the sense component 250 (e.g., a sense amplifier of the sense component 250) may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 or other storage element of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

In some examples, portions of access operations (e.g., sub-operations) may be triggered or initiated according to relative timing that is supported by delay components or delay chains of the memory die 200 (e.g., of the local memory controller 265). The delay components may generate timing or logical signals for initiating various operations of the memory die 200 relative to a clock signal (e.g., a CK signal) or other access signal (e.g., access command), which may be received from a host device 105. In some examples, portions of a given access operation may be asynchronous relative to a clock signal or access signal (e.g., occurring at some timing within a clock cycle or set of clock cycles), and delay components may therefore support core timing signals of the memory die 200 that are asynchronous (e.g., relative to a clock signal or access signal).

In some examples, access operations performed by the memory die 200 may have a temperature dependence that causes certain supporting operations to take a longer or shorter duration to complete based on a relevant temperature. For example, resistance of an access line (e.g., a word line 210, a digit line 215, a plate line 220) may increase with temperature, such that charge transfer or current flow via an access line may be slower or otherwise reduced at relatively higher temperatures and faster or otherwise increased at relatively lower temperatures. In another example, carrier mobility of a transistor may decrease with temperature, such that charge transfer or current flow across the transistor (e.g., drain current) may be slower at relatively higher temperatures and faster at relatively lower temperatures. Additionally or alternatively, decreased carrier mobility may be associated with a relatively slower activation of a conductive path through the transistor (e.g., relatively slower switching, relatively longer activation time constant), such that charge transfer or current flow across the transistor may develop more slowly at relatively higher temperatures and more quickly at relatively lower temperatures. Accordingly, for these or other reasons, the memory die 200 may be configured to perform different portions of an access operation according to either a longer or shorter duration, depending on a temperature of the memory die 200, or other portion of a system 100 that includes the memory die 200.

To support performing portions of an access operation according to a longer or shorter duration based on temperature, the memory die 200 may include delay components that are operable based at least in part on a relevant temperature. In some examples, a delay component may be configured to support a respective duration that is based at least in part on a temperature that is measured at the memory die 200 (e.g., at a local memory controller 265), or another portion of a memory device 110 that includes the memory die 200 (e.g., a device memory controller 155), or a portion of a host device 105 coupled with a memory device 110 that includes the memory die 200 (e.g., an external memory controller 120). Such techniques may employ a thermocouple, a thermistor, a resistance temperature detector (RTD), or other transducer coupled with a delay component that provides a signal indicative of temperature. Additionally or alternatively, a delay component may be configured to support a respective delay or duration that is based at least in part on circuitry or circuit components of the delay component having operational characteristics that are dependent on a temperature of the memory die 200 (e.g., delay circuitry responsive to a temperature of the memory die 200 without directly measuring temperature).

In some examples, a memory die 200 may employ delay components that support a delay or duration that is proportional to temperature (e.g., directly proportional to temperature, proportional to absolute temperature (PTAT)) to generate core timing signals of the memory die 200. PTAT delay components may be suitable to support the timing of some portions of an access operation, such as those portions of an access operation that are affected by an increase in resistance with increased temperature, a reduction in transistor carrier mobility with increased temperature, and other phenomena. In such examples, a PTAT delay component may support a relatively longer duration for a portion of an access operation at a relatively higher temperature, and a relatively shorter duration for the portion of the access operation at a relatively lower temperature.

Although PTAT delay components may support access operation durations that are proportional to temperature (e.g., according a duration=k*Temperature relationship), such components are one example for supporting a respective duration of an access operation (e.g., a duration of a sub-operation) that is configured to increase in response to an increase in temperature of the memory die 200 or decrease in response to a decrease in temperature of the memory die 200. More generally, the described PTAT delay components may be one example of a delay component configured to support, for a portion of an access operation, a respective first duration at a first temperature and a respective second duration, longer than the first duration, at a second temperature that is higher than the first temperature. Such a delay component may have any relevant positive correlation with temperature (e.g., linear, quadratic, polynomial, exponential, hyperbolic, root), which may be provided with an explicit (e.g., mathematical, coded, configured) relationship, or an implicit relationship (e.g., based on intrinsic characteristics of associated circuitry or circuit components), and which may be continuous (e.g., smooth) or discontinuous (e.g., stepped, discrete).

In some examples, a memory die 200 may be operated without delay components to generate core timing signals of the memory die 200, or may be operated using PTAT delay components to generate core timing signals for some or all of the portions of an access operation. However, performance of the memory die 200 may be improved by supporting one or more portions of an access operation having a duration that is relatively shorter at relatively higher temperatures. For example, in some memory architectures, signal development operations associated with accessing a memory cell may operate according to a different temperature dependence than other portions of a circuit coupled with the memory cell. In one example, a ferroelectric memory cell architecture may support relatively faster or stronger development of read signals at elevated temperatures, and therefore a read signal development duration may be configured to be relatively shorter at higher temperatures. In another example, a material memory cell architecture may support relatively faster changes in material state at elevated temperatures, and therefore a write duration may be configured to be relatively shorter at higher temperatures.

In some examples, a memory die 200 may support such techniques by employing one or more delay components that support a delay or duration that is inversely proportional to temperature (e.g., complementary to absolute temperature (CTAT)) to generate core timing signals of the memory die 200. CTAT delay components may be suitable to support the timing of some portions of an access operation, such as those portions of an access operation that occur more quickly at elevated temperatures (e.g., a signal development portion of a read operation performed on a ferroelectric memory cell). In such examples, a CTAT delay component may support a relatively shorter duration for a portion of an access operation at a relatively higher temperature, and a relatively longer duration for the portion of the access operation at a relatively lower temperature.

Although CTAT delay components may support access operation durations that are inversely proportional to temperature (e.g., according a duration=k/Temperature relationship), such components are one example for supporting a respective duration of an access operation (e.g., a duration of a sub-operation) that is configured to decrease in response to an increase in temperature of the memory die 200 or increase in response to a decrease in temperature of the memory die 200. More generally, the described CTAT delay components may be one example of a delay component configured to support, for a portion of an access operation, a respective first duration at a first temperature and a respective second duration, shorter than the first duration, at a second temperature that is higher than the first temperature. Such a delay component may have any relevant inverse or negative correlation with temperature (e.g., linear, quadratic, polynomial, exponential, hyperbolic, root), which may be provided with an explicit (e.g., mathematical, coded, configured) relationship, or an implicit relationship (e.g., based on intrinsic characteristics of associated circuitry or circuit components), and which may be continuous (e.g., smooth) or discontinuous (e.g., stepped, discrete).

Thus, in various examples, a memory die 200 may include one or more PTAT delay components, one or more CTAT delay components, or any various combination thereof, to support various access operations on the memory die 200. In some examples, a chain of PTAT and CTAT delay components may be used to support a chain of sub-operations of a given access operation, and different types of access operations may be associated with different chains of delay components. For example, read operations of the memory die 200 may be supported with a first combination of PTAT and/or CTAT delay components, and write operations of the memory die 200 may be supported with a second combination of PTAT and/or CTAT delay components that is different than the first combination. In some examples, such configurations may support managing overall durations of access operations, reducing variability of access operations, improving read margins, reducing bit error rates (BER), or otherwise improving robustness to temperature variability, among other benefits. Although described in the context of the memory die 200, in some examples, such delay components may be located in a different part of a memory device, such as a device memory controller 155, or distributed among various components or subcomponents of a memory device 110.

Figure 3A:
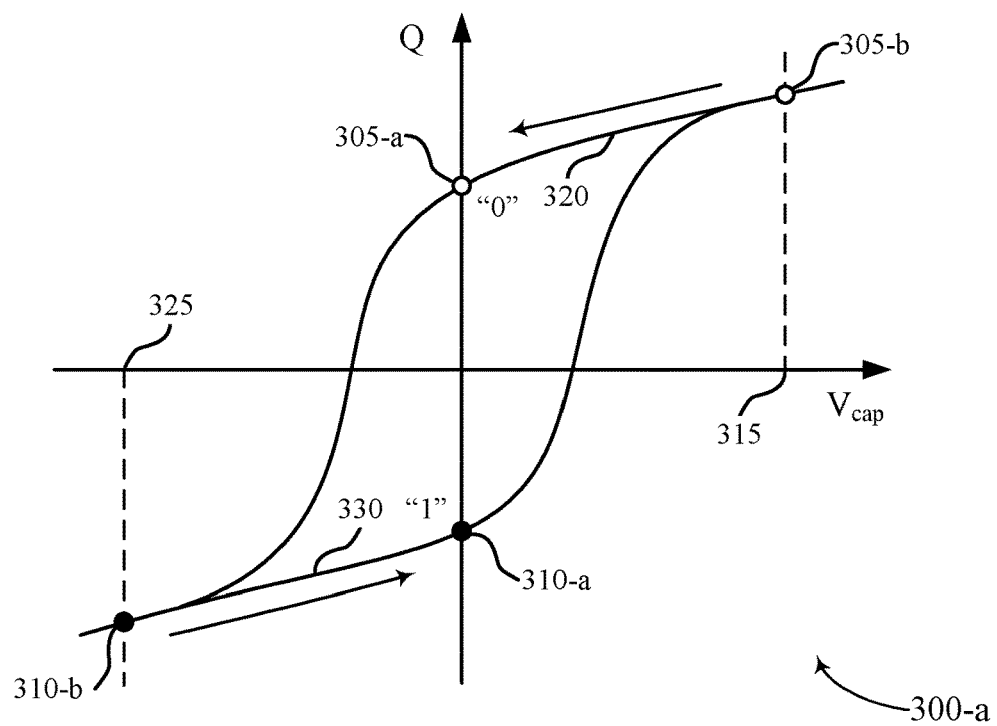
FIGS. 3A and 3B illustrate examples of non-linear electrical properties of a ferroelectric memory cell with hysteresis plots in accordance with various examples as disclosed herein.
Figure 3B:
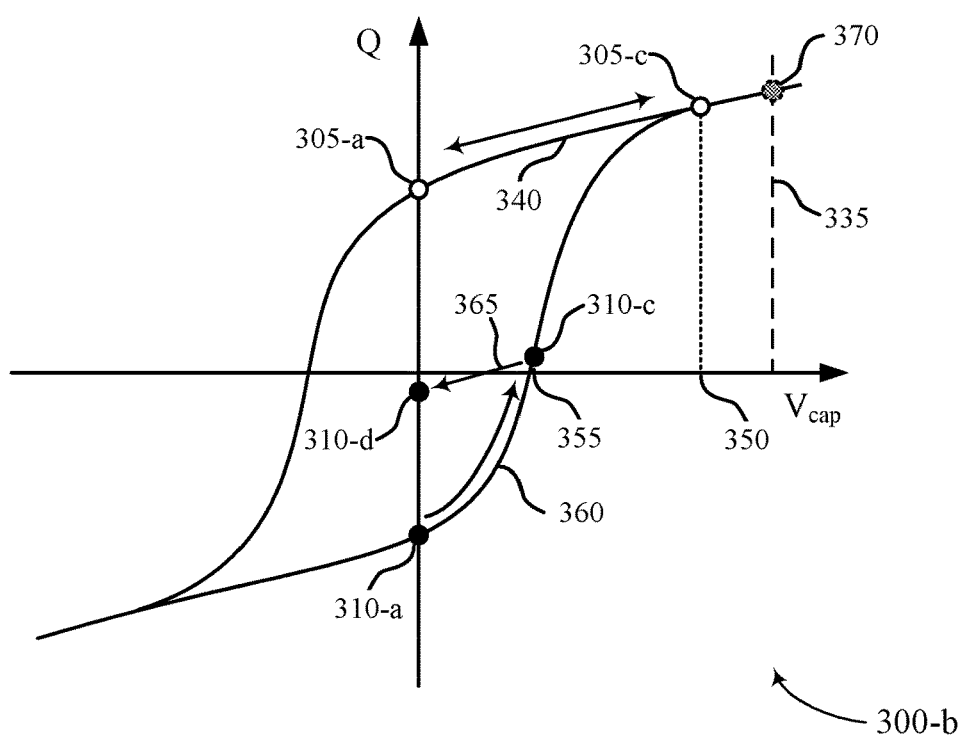

FIGS. 3A and 3B illustrate examples of non-linear electrical properties of a ferroelectric memory cell with hysteresis plots 300-$a$ and 300-$b$, respectively, in accordance with various examples as disclosed herein. The hysteresis plots 300-$a$ and 300-$b$ may illustrate examples of a writing process and a reading process, respectively, for a memory cell 205 employing a ferroelectric capacitor 240 as described with reference to FIG. 2. The hysteresis plots 300-$a$ and 300-$b$ depict the charge, Q, stored on the ferroelectric capacitor 240 as a function of a voltage difference $V_{cap}$, between the terminals of the ferroelectric capacitor 240 (e.g., when charge is permitted to flow into or out of the ferroelectric capacitor 240 according to the voltage difference $V_{cap}$). For example, the voltage difference $V_{cap}$ may represent the difference in voltage between a digit line side of the capacitor 240 and a plate line side of the capacitor 240 (e.g., $V_{bottom}$-$V_{plate}$, $V_{DL}$-$V_{PL}$).

A ferroelectric material is characterized by an electric polarization where the material may maintain a non-zero electric charge in the absence of an electric field. Examples of ferroelectric materials include barium titanate ($BaTiO_3$), lead titanate ($PbTiO_3$), lead zirconium titanate (PZT), and strontium bismuth tantalate (SBT). Ferroelectric capacitors 240 described herein may include these or other ferroelectric materials. Electric polarization within a ferroelectric capacitor 240 results in a net charge at the surface of the ferroelectric material, and attracts opposite charge through the terminals of the ferroelectric capacitor 240. Thus, charge may be stored at the interface of the ferroelectric material and the capacitor terminals.

The hysteresis plots 300-$a$ and 300-$b$ may be understood from the perspective of a single terminal of a ferroelectric capacitor 240, and the voltages in the hysteresis plots 300-$a$ and 300-$b$ may represent a voltage difference across the capacitor (e.g., an electric potential between the terminals of the ferroelectric capacitor 240). For example, a positive voltage may be realized by applying a positive voltage to the perspective terminal (e.g., a cell bottom) and maintaining the reference terminal (e.g., a cell plate) at ground or virtual ground (or approximately zero volts (0V)). In some examples, a negative voltage may be applied by maintaining the perspective terminal at ground and applying a positive voltage to the reference terminal (e.g., cell plate). In other words, positive voltages may be applied to arrive at a negative voltage difference $V_{cap}$ across the ferroelectric capacitor 240 and thereby negatively polarize the terminal in question. Similarly, two positive voltages, two negative voltages, or any combination of positive and negative voltages may be applied to the appropriate capacitor terminals to generate the voltage difference $V_{cap}$ shown in the hysteresis plots 300-$a$ and 300-$b$.

As depicted in the hysteresis plot 300-$a$, a ferroelectric material used in a ferroelectric capacitor 240 may maintain a positive or negative polarization when there is no net voltage difference between the terminals of the ferroelectric capacitor 240. For example, the hysteresis plot 300-$a$ illustrates two possible polarization states, a charge state 305-$a$ and a charge state 310-$a$, which may represent a negatively saturated polarization state and a positively saturated polarization state, respectively. The charge states 305-$a$ and 310-$a$ may be at a physical condition illustrating remnant polarization (Pr) values, which may refer to the polarization (or charge) that remains upon removing an external bias (e.g., voltage). According to the example of the hysteresis plot 300-$a$, the charge state 305-$a$ may represent a logic 0 when no voltage difference is applied across the ferroelectric capacitor 240, and the charge state 310-$a$ may represent a logic 1 when no voltage difference is applied across the ferroelectric capacitor 240. In some examples, the logic values of the respective charge states or polarization states may be reversed or interpreted in an opposite manner to accommodate other schemes for operating a memory cell 205.

A logic 0 or 1 may be written to the memory cell by controlling the electric polarization of the ferroelectric material, and thus the charge on the capacitor terminals, by applying a net voltage difference across the ferroelectric capacitor 240. For example, the voltage 315 may be a voltage equal to or greater than a positive saturation voltage, and applying the voltage 315 across the ferroelectric capacitor 240 may result in charge accumulation until the charge state 305-$b$ is reached (e.g., writing a logic 0). Upon removing the voltage 315 from the ferroelectric capacitor 240 (e.g., applying a zero net voltage across the terminals of the ferroelectric capacitor 240), the charge state of the ferroelectric capacitor 240 may follow the path 320 shown between the charge state 305-$b$ and the charge state 305-$a$ at zero voltage across the capacitor. In other words, charge state 305-$a$ may represent a logic 0 state at an equalized voltage across a ferroelectric capacitor 240 that has been positively saturated.

Similarly, voltage 325 may be a voltage equal to or lesser than a negative saturation voltage, and applying the voltage 325 across the ferroelectric capacitor 240 may result in charge accumulation until the charge state 310-$b$ is reached (e.g., writing a logic 1). Upon removing the voltage 325 from the ferroelectric capacitor 240 (e.g., applying a zero net voltage across the terminals of the ferroelectric capacitor 240), the charge state of the ferroelectric capacitor 240 may follow the path 330 shown between the charge state 310-$b$ and the charge state 310-$a$ at zero voltage across the capacitor. In other words, charge state 310-$a$ may represent a logic 1 state at an equalized voltage across a ferroelectric capacitor 240 that has been negatively saturated. In some examples, the voltage 315 and the voltage 325, representing saturation voltages, may have the same magnitude, but opposite polarity across the ferroelectric capacitor 240.

To read, or sense, the stored state of a ferroelectric capacitor 240, a voltage may also be applied across the ferroelectric capacitor 240. In response to the applied voltage, the subsequent charge Q stored by the ferroelectric capacitor changes, and the degree of the change may depend on the initial polarization state, the applied voltages, intrinsic or other capacitance on access lines, and other factors. In other words, the charge state or access line voltage resulting from a read operation may depend on whether the charge state 305-a, or the charge state 310-a, or some other charge state was initially stored, among other factors.

The hysteresis plot 300-b illustrates an example for reading stored charge states 305-a and 310-a. A read voltage 335 may be applied, for example, as a voltage difference via a digit line 215 and a plate line 220 as described with reference to FIG. 2. The hysteresis plot 300-b may illustrate read operations where the read voltage 335 is positive voltage difference $V_{cap}$ (e.g., where $V_{bottom}$-$V_{plate}$ is positive, where $V_{DL}$ is greater than $V_{PL}$). A positive read voltage across the ferroelectric capacitor 240 may be referred to as a "plate low" read operation, where a digit line 215 is taken initially to a high voltage, and a plate line 220 is initially at a low voltage (e.g., a ground voltage). Although the read voltage 335 is shown as a positive voltage across the ferroelectric capacitor 240, in alternative access operations a read voltage may be a negative voltage across the ferroelectric capacitor 240, which may be referred to as a "plate high" read operation.

The read voltage 335 may be applied across the ferroelectric capacitor 240 while a memory cell 205 is selected (e.g., by activating a switching component 245 via a word line 210 as described with reference to FIG. 2). Upon applying the read voltage 335 to the ferroelectric capacitor 240, charge may flow into or out of the ferroelectric capacitor 240 via the associated digit line 215 and plate line 220, and, in some examples, different charge states or access line voltages may result depending on whether the ferroelectric capacitor 240 was at the charge state 305-a (e.g., storing a logic 0) or at the charge state 310-a (e.g., storing a logic 1), or some other charge state.

When performing a read operation on a ferroelectric capacitor 240 at the charge state 305-a (e.g., a logic 0), additional positive charge may accumulate across the ferroelectric capacitor 240, and the charge state may follow path 340 until reaching the charge and voltage of the charge state 305-c. The amount of charge flowing through the capacitor 240 may be related to the intrinsic or other capacitance of the digit line 215 or other access line. In a "plate low" read configuration, a read operation associated with the charge states 305-a and 305-c, or more generally a read operation associated with the logic 0 state, may be associated with a relatively small amount of charge transfer (e.g., compared to a read operation associated with the charge states 310-a and 310-c, or more generally the logic 1 state).

As shown by the transition between the charge state 305-a and the charge state 305-c, the resulting voltage 350 across the ferroelectric capacitor 240 may be a relatively large positive value due to the relatively large change in voltage at the capacitor 240 for the given change in charge. Thus, upon reading a logic 0 in a "plate low" read operation, the digit line voltage, equal to the sum of $V_{PL}$ and $V_{cap}$ (e.g., $V_{bottom}$-$V_{plate}$) at the charge state 305-c, may be a relatively high voltage. Such a read operation may not change the remnant polarization of the ferroelectric capacitor 240 that stored the charge state 305-a, and thus after performing the read operation the ferroelectric capacitor 240 may return to the charge state 305-a via path 340 when the read voltage 335 is removed (e.g., by applying a zero net voltage across the ferroelectric capacitor 240, by equalizing the voltage across the ferroelectric capacitor 240). Thus, performing a read operation with a positive read voltage on a ferroelectric capacitor 240 with a charge state 305-a may be considered a non-destructive read process.

When performing the read operation on the ferroelectric capacitor 240 at the charge state 310-a (e.g., a logic 1), the stored charge may reverse polarity as a net positive charge accumulates across the ferroelectric capacitor 240, and the charge state may follow the path 360 until reaching the charge and voltage of the charge state 310-c. The amount of charge flowing through the ferroelectric capacitor 240 may again be related to the intrinsic or other capacitance of the digit line 215 or other access line. In a "plate low" read configuration, a read operation associated with the charge states 310-a and 310-c, or more generally a read operation associated with the logic 1 state, may be associated with a relatively large amount of charge transfer (e.g., compared to a read operation associated with the charge states 305-a and 305-c, or more generally the logic 0 state).

As shown by the transition between the charge state 310-a and the charge state 310-c, the resulting voltage 355 may, in some cases, be a relatively small positive value due to the relatively small change in voltage at the capacitor 240 for the given change in charge. Thus, upon reading a logic 1 in a "plate low" read operation, the digit line voltage, equal to the sum of $V_{PL}$ and $V_{cap}$ (e.g., $V_{bottom}$-$V_{plate}$) at the charge state 310-c, may be a relatively low voltage.

The transition from the charge state 310-a to the charge state 310-d may be illustrative of a sensing operation that is associated with a partial reduction or partial reversal in polarization or charge of a ferroelectric capacitor 240 of a memory cell 205 (e.g., a reduction in the magnitude of charge Q from the charge state 310-a to the charge state 310-d). In other words, according to the properties of the ferroelectric material, after performing the read operation the ferroelectric capacitor 240 may not return to the charge state 310-a when the read voltage 335 is removed (e.g., by applying a zero net voltage across the ferroelectric capacitor 240, by equalizing the voltage across the ferroelectric capacitor 240). Rather, when applying a zero net voltage across the ferroelectric capacitor 240 after a read operation of the charge state 310-a with read voltage 335, the charge state may follow path 365 from the charge state 310-c to the charge state 310-d, illustrating a net reduction in polarization magnitude (e.g., a less positively polarized charge state than initial charge state 310-a, illustrated by the difference in charge between the charge state 310-a and the charge state 310-d). Thus, performing a read operation with a positive read voltage on a ferroelectric capacitor 240 with a charge state 310-a may be described as a destructive read process. However, in some sensing schemes, a reduced remnant polarization may still be read as the same stored logic state as a saturated remnant polarization state (e.g., supporting detection of a logic 1 from both the charge state 310-a and the charge state 310-d), thereby providing a degree of non-volatility for a memory cell 205 with respect to read operations.

The position of the charge state 305-c and the charge state 310-c after initiating a read operation may depend on a number of factors, including the specific sensing scheme and circuitry. In some cases, the final charge may depend on the net capacitance of a digit line 215 coupled with the memory cell 205, which may include an intrinsic capacitance, an integrator capacitor, and others. For example, if a ferroelectric capacitor 240 is electrically coupled with a plate line 220 at 0V and the read voltage 335 is applied to a digit line 215, the voltage of the digit line 215 may fall when the memory cell 205 is selected due to charge flowing from the net capacitance of the digit line 215 to the ferroelectric capacitor 240. Thus, in some examples, a voltage measured at a sense component 250 may not be equal to the read voltage 335, or the resulting voltages 350 or 355, and instead may depend on the voltage of the digit line 215 or other access line following a period of charge sharing.

The position of the charge state 305-c and the charge state 310-c on hysteresis plot 300-b upon initiating a read operation may depend on the net capacitance of a digit line 215 or other access line, and may be determined through a load-line analysis. In other words, the charge states 305-c and 310-c may be defined with respect to the net capacitance of the digit line 215, or other access line (e.g., signal line). As a result, the voltage of the ferroelectric capacitor 240 after initiating a read operation (e.g., voltage 350 when reading the ferroelectric capacitor 240 that stored the charge state 305-a, voltage 355 when reading the ferroelectric capacitor 240 that stored the charge state 310-a), may be different and may depend on the initial state of the ferroelectric capacitor 240. In some examples, the amount of change in polarization of a ferroelectric capacitor 240 of a memory cell 205 as a result of a sensing operation may be selected according to a particular sensing scheme.

The initial state (e.g., charge state, logic state) of the ferroelectric capacitor 240 may be determined by comparing the voltage of a digit line 215 (or signal line, where applicable) resulting from the read operation with a reference voltage (e.g., via a reference line 255 as described with reference to FIG. 2). In some examples, the digit line voltage may be the sum of the plate line voltage and the final voltage across the ferroelectric capacitor 240 (e.g., voltage 350 when reading the ferroelectric capacitor 240 having a stored charge state 305-a, or voltage 355 when reading the ferroelectric capacitor 240 having a stored charge state 310-a). In some examples, the digit line voltage may be the difference between the read voltage 335 and the final voltage across the capacitor 240 (e.g., (read voltage 335-voltage 350) when reading the ferroelectric capacitor 240 having a stored charge state 305-a, (read voltage 335-voltage 355) when reading the ferroelectric capacitor 240 having a stored charge state 310-a).

In some examples, read operations of a memory cell 205 may be associated with a fixed voltage of a digit line 215, where a charge state of a ferroelectric capacitor 240 after initiating a read operation may be the same regardless of its initial charge state. For example, in a read operation where a digit line 215 is held at a fixed read voltage 335, the ferroelectric capacitor 240 may proceed to a charge state 370 for both the case where the ferroelectric capacitor initially stored a charge state 305-a and the case where the ferroelectric capacitor initially stored a charge state 310-a. Accordingly, rather than using a difference in voltage of a digit line 215 to detect an initial charge state or logic state, in some examples, the initial charge state or logic state of the ferroelectric capacitor 240 may be determined based at least in part on the difference in charge associated with the read operation. For example, as illustrated by hysteresis plot 300-b, a logic 0 may be detected based on difference in charge, Q, between charge state 305-a and charge state 370 (e.g., a relatively small amount of charge transfer), and a logic 1 may be detected based on a difference in charge, Q, between charge state 310-a and charge state 370 (e.g., a relatively large amount of charge transfer).

In some examples, such a detection may be supported by a charge-transfer sensing amplifier (CTSA), a cascode (e.g., a transistor configured in a cascode arrangement), or other signal development circuitry between a digit line 215 and a signal line (e.g., of a sense component 250), where a voltage of the signal line may be based at least in part on the amount of charge transfer of a capacitor 240 after initiating a read operation (e.g., where the described charge transfer may correspond to an amount of charge that passes through the charge-transfer sensing amplifier, cascode, or other signal development circuitry). In such examples, the voltage of the signal line may be compared with a reference voltage (e.g., at a sense amplifier of a sense component 250) to determine the logic state initially stored by the ferroelectric capacitor 240, despite the digit line 215 being held at a fixed voltage level.

In some examples where a digit line 215 is held at a fixed read voltage 335, a capacitor 240 may be positively saturated after a read operation irrespective of whether the capacitor 240 was initially at a charge state 305-a (e.g., a logic 0) or initially at a charge state 310-a (e.g., a logic 1). Accordingly, after such a read operation, the capacitor 240 may, at least temporarily, be charged according to a logic 1 state irrespective of its initial or intended logic state. Thus, a rewrite operation (e.g., a PRE operation) may be performed at least when the capacitor 240 is intended to store a logic 1 state, where such a rewrite operation may include applying a write voltage 325 to store a logic 1 state as described with reference to hysteresis plot 300-a. Such rewrite operations may be configured or otherwise described as a selective rewrite operation, since a rewrite voltage may not need to be applied when the capacitor 240 is intended to store a logic 0 state. In some examples, such an access scheme may be referred to as a "2Pr" scheme, where the difference in charge for distinguishing a logic 0 from a logic 1 may be equal to two times the remnant polarization of a memory cell 205 (e.g., a difference in charge between charge state 305-a, a positively saturated charge state, and charge state 310-a, a negatively saturated charge state).

In some examples, a characteristic behavior of a ferroelectric memory architecture may change based on a temperature of an associated memory device 110 (e.g., of a memory array 170). For example, one or more of a saturation polarization (e.g., a charge, Q, at an equalized voltage), a recoil characteristic (e.g., a linear capacitance of the ferroelectric capacitor, a slope of charge versus voltage of a path 320, 330, 340, or 365, a rate of charge or polarization change, a rate of charge or discharge), or a coercivity (e.g., a voltage involved in changing or reversing a polarization state) of a ferroelectric capacitor may change based at least in part on a change in temperature of the ferroelectric capacitor. Additionally or alternatively, a time derivative (e.g., rate) of charge transfer or polarization change (e.g., a charge mobility, a polarization mobility) of a ferroelectric capacitor may change based at least in part on a change in temperature of the ferroelectric capacitor.

In some examples, one or more of such phenomena, or some combination thereof, may be associated with a characteristic duration for signal development being relatively longer at lower temperatures, and relatively shorter at higher temperatures. For example, when reading a memory cell 205 with a ferroelectric capacitor 240 at a relatively elevated temperature, charge may be transferred relatively quickly, or with a relatively greater magnitude, to a digit line 215 that is coupled with the memory cell 205. In such an example, as a result of the relatively faster or stronger charge transfer, a signal development time for the ferroelectric memory architecture (e.g., for reading or writing a ferroelectric memory cell within the architecture) may be configured with a relatively shorter duration at higher temperatures. In accordance with examples as disclosed herein, a CTAT delay component, or other delay component that shortens a characteristic duration in response to an increase in temperature, may accordingly be used to support signal development timing when accessing a ferroelectric memory cell 205. Such techniques may support an improved alignment with the ferroelectric memory cell behavior as compared to using a PTAT delay component, or no delay component.

Figure 4:
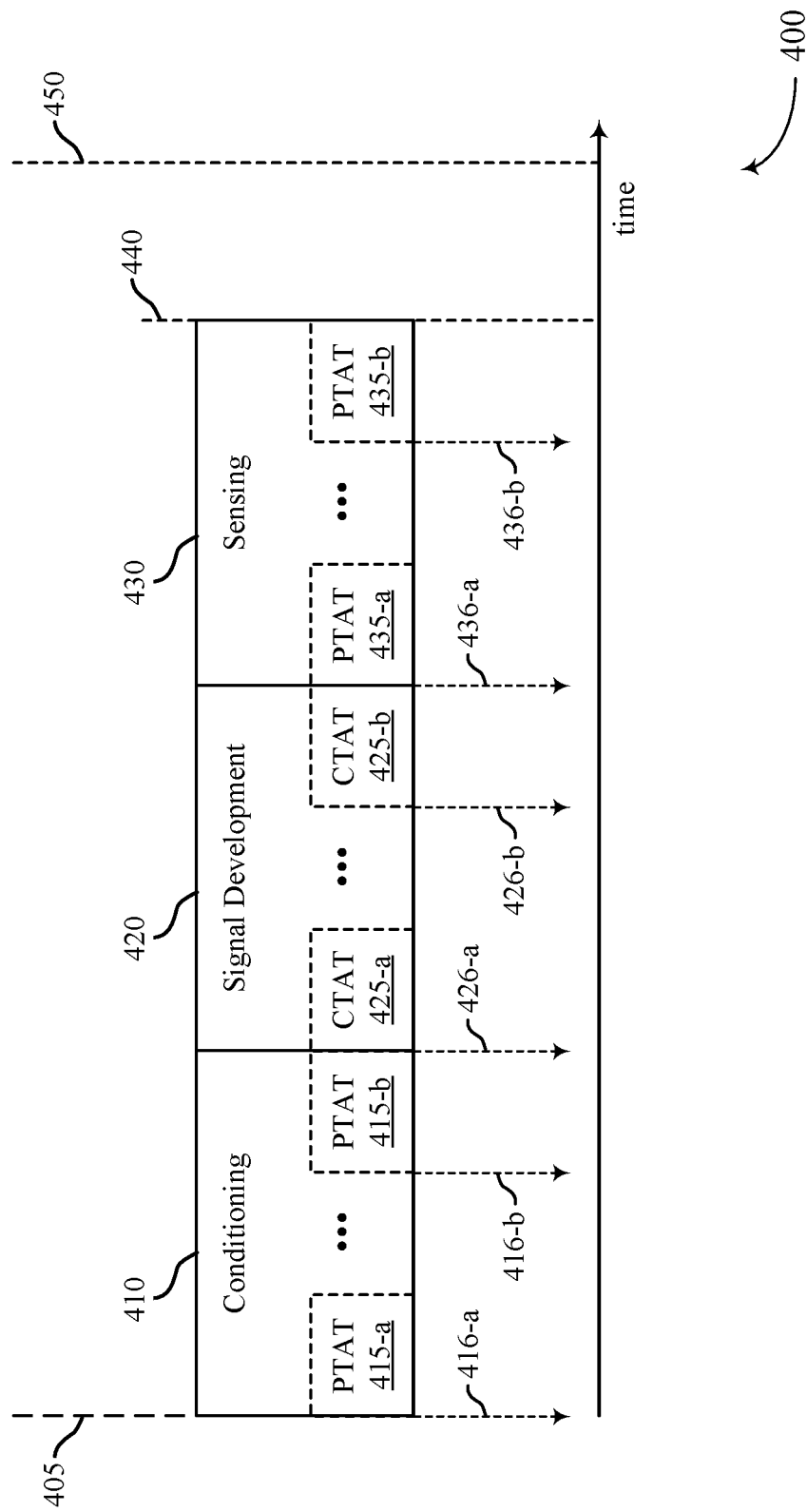
FIG. 4 illustrates an example of a timing sequence that supports temperature-based access timing for a memory device in accordance with examples as disclosed herein.

FIG. 4 illustrates an example of a timing sequence 400 that supports temperature-based access timing for a memory device in accordance with examples as disclosed herein. The timing sequence 400 may illustrate aspects of a read operation performed by a memory device 110, such as a read operation performed on a memory cell 205 having a ferroelectric capacitor 240. In the example of timing sequence 400, a read operation may include a conditioning portion 410, a signal development portion 420, and a sensing portion 430 which, collectively, may include various portions of the read operation. The timing sequence 400 may include operations that begin at time 405 and end at time 440, and are performed within an overall time window (e.g., an allocated time) that concludes at time 450. In some examples, the duration between time 405 and time 450 may refer to a row address (RAS) to column address (CAS) delay, which may be referred to as tRCD. In some cases (e.g., for some memory device architectures and memory cell types), tRCD may refer to a time (e.g., in terms of number of clock cycles) between when a memory device receives an activation (ACT) command and when the memory device may receive an access (e.g., read or write) command for memory cells (or digit lines) associated with the activated word line. A duration between time 405 and time 440 may be referred to as a pseudo-tRCD, and a difference in durations between tRCD and pseudo-tRCD being related to an overhead timing or timing margin to accommodate various variations.

The timing sequence 400 may illustrate various sets of sub-operations associated with completing an read operation. For example, in some access schemes for reading a ferroelectric memory cell 205, the timing sequence 400 may include 18 asynchronous timing events, which may be distributed between the conditioning portion 410, the signal development portion 420, and the sensing portion 430. In another example, in some access schemes for reading a DRAM memory cell 205, the timing sequence 400 may include four asynchronous timing events, which may be distributed between the conditioning portion 410, the signal development portion 420, and the sensing portion 430. However, the discussion of the timing sequence 400, including reference to timing signals, delays, and operational durations, may be relevant to any quantity of operations of a read operation, and may also be relevant other access operation (e.g., write operation, rewrite operation, refresh operation), which may or may not include a conditioning portion 410, a signal development portion 420, and a sensing portion 430.

The timing sequence 400 may begin with a conditioning portion 410, including one or more associated sub-operations of the read operation, which begins at time 405. In some examples, time 405 may be aligned with or offset from a clock signal (e.g., a CK signal) or other access signal received from a host device 105, or may be aligned an initiation time internal to the memory device 110 that is otherwise associated with a clock signal or access command. In some examples, the time 405 may be aligned with the initiation of a first operation of the conditioning portion 410, such as an operation initiated by a timing signal 416-a. In some examples, a first operation of the conditioning portion 410 may be performed some duration or delay after the time 405, where such a duration or delay may or may not be dependent on temperature.

The conditioning portion 410 may include various operations associated with conditioning, preparing, or otherwise establishing a condition of a memory array 170, access line (e.g., word line 210, digit line 215, plate line 220), or signal development circuitry (e.g., of a sense component 250) prior to accessing a memory cell 205 to be read. In some examples, the conditioning portion 410 may include operations associated with biasing, precharging, equalizing, or otherwise setting a baseline condition for a plate line 220 or common plate node of a memory array 170. In some examples, the conditioning portion 410 may include operations associated with biasing, precharging, equalizing, or otherwise setting a baseline condition for a digit line 215 or other access line between a memory cell 205 and a sense component 250 (e.g., a signal line between the memory cell 205 and a sense amplifier), or a reference line coupled with the sense component 250. In some examples, the conditioning portion 410 may be referred to as a digit line precharge portion. In some examples, the conditioning portion 410 may include operations associated with biasing, charging, or boosting a voltage of an integrator or amplification capacitor used for subsequent signal development. In some examples, the conditioning portion 410 may include operations associated with selectively coupling a digit line 215 with a sense component 250, which may include operations associated with column selection or multiplexing component.

In some examples, the operations of the conditioning portion 410 may have characteristic durations that increase with increasing temperature. For example, durations of operations of the conditioning portion 410 may be affected by an increase in resistance with increased temperature, a reduction in transistor carrier mobility with increased temperature, or other phenomena, including examples as described herein. In some examples, conditioning operations may be associated with a time constant behavior, where the time constant is longer at relatively higher temperatures and shorter at relatively lower temperatures. Accordingly, operations of the conditioning portion 410 may be performed (e.g., initiated, triggered) according to a delay, duration, or other timing organization that is relatively longer at relatively higher temperatures, and relatively shorter at relatively lower temperatures.

In one example, the conditioning portion 410 may have timing signals generated by PTAT delay components, associated with durations or delays that are proportional to a temperature of the memory device 110. For example, after initiating an operation with timing signal 416-a, a subsequent operation may be delayed by a duration for performing the operation that is proportional to temperature. In other words, a subsequent operation may be triggered or initiated after some characteristic delay, such as PTAT delay 415-a, that is proportional to temperature. Each operation of the conditioning portion 410 may be triggered or initiated by a corresponding timing signal 416, and may be performed over a corresponding PTAT delay 415 that is configured to allow the operation to complete, or to be completed within some threshold amount of completion that supports the read operation associated with the timing sequence 400.

By using PTAT delays 415, or other delays that increase in response to increasing temperatures and decrease in response to decreasing temperatures, the timing sequence 400 may support a reduction in variation of the operations of the conditioning portion 410 that might otherwise result from different operating temperatures of an associated memory device 110, and otherwise manage the overall duration of the timing sequence 400. For example, increasing delays of the conditioning portion 410 at relatively higher temperatures may support operational durations of the conditioning portion 410 tracking characteristic time constant behavior more closely, thereby reducing variations of such operations due to temperature variations.

The signal development portion 420 may include one or more operations associated with developing a signal based on accessing a memory cell 205, where such a signal may be used to evaluate an information state stored by the memory cell 205. In some examples, the signal development portion 420 may include selecting a memory cell 205, such as activating a word line 210 or activating a switching component 245. In some examples, the signal development portion 420 may include a charge transfer with a capacitor 240, such as a ferroelectric capacitor 240. In some examples, the signal development portion 420 may include a charge transfer of an amplification or integrator capacitor, where such a charge transfer may be based at least in part on accessing the memory cell 205 (e.g., based at least in part on a logic state stored by the memory cell 205). In some examples, the signal development portion 420 may include a charge integration operation that generates a read signal (e.g., read voltage) to be compared to a reference voltage, which may include operations of a charge transfer sensing amplifier, a cascode, or other signal development circuitry (e.g., of a sense component 250) configured to generate a read signal.

In some examples, the operations of the signal development portion 420 may have characteristic durations that decrease with increasing temperature. For example, durations of operations of the signal development portion 420 may be affected by a saturation polarization characteristic, a recoil characteristic, or a coercivity of a ferroelectric capacitor that changes based at least in part on a change in temperature of the ferroelectric capacitor. Additionally or alternatively, durations of operations of the signal development portion 420 may be affected by a change in a time derivative of charge transfer or polarization change (e.g., a charge mobility, a polarization mobility) of a ferroelectric capacitor that changes based at least in part on a change in temperature of the ferroelectric capacitor, or some other phenomena, including examples as described herein. In some examples, signal development may be associated with a time constant behavior, where the time constant is shorter at relatively higher temperatures and longer at relatively lower temperatures. Accordingly, operations of the signal development portion 420 may be performed (e.g., initiated, triggered) according to a delay, duration, or other timing organization that is relatively shorter at relatively higher temperatures, and relatively longer at relatively lower temperatures.

In one example, the signal development portion 420 may have timing signals generated by CTAT delay components, associated with durations or delays that are inversely proportional to a temperature of the memory device 110. For example, after initiating an operation with timing signal 426-a, a subsequent operation may be delayed by a duration for performing the operation that is inversely proportional to temperature. In other words, a subsequent operation may be triggered or initiated after some characteristic delay, such as CTAT delay 425-a, that is inversely proportional to temperature. Each operation of the signal development portion 420 may be triggered or initiated by a corresponding timing signal 426, and may be performed over a corresponding CTAT delay 425 that is configured to allow the operation to complete, or to be completed within some threshold amount of completion that supports the read operation associated with the timing sequence 400.

By using CTAT delays 425, or other delays that decrease in response to increasing temperatures and increase in response to decreasing temperatures, the timing sequence 400 may support a reduction in variation of the operations of the signal development portion 420 that might otherwise result from different operating temperatures of an associated memory device 110, and otherwise manage the overall duration of the timing sequence 400. For example, decreasing delays of the signal development portion 420 at relatively higher temperatures may support operational durations of the signal development portion 420 tracking characteristic time constant behavior more closely, thereby reducing variations of such operations due to temperature variations In some examples, the signal development portion 420 may support tracking characteristic durations associated with accessing a memory cell of a particular memory architecture, such as improving alignment with polarization or displacement characteristics of a ferroelectric memory cell 205.

The sensing portion 430 may include one or more operations associated with sensing, latching, or communicating a logic state stored by the memory cell 205 (e.g., based at least in part on a signal developed during the signal development portion 420). In some examples, the sensing portion 430 may include coupling a signal line or a signal development component with a sense amplifier (e.g., of a sense component 250), or otherwise conveying a developed sense signal to a sense amplifier. In some examples, the sensing portion 430 may include isolating a signal line or a signal development component from a sense amplifier (e.g., isolating or opening an electrical connection by deactivating a transistor). In some examples, the sensing portion may include applying power to a sense amplifier, such as selectively coupling one or more voltage sources with the sense amplifier, which may be referred to or otherwise include firing the sense amplifier or latching the sense amplifier. In some examples, the sensing portion 430 may include conveying a detected logic state (e.g., a latched read signal) to an input/output component 260, which may support communicating sensed information to a host device 105, or some other portion of a memory device.

In some examples, the operations of the sensing portion 430 may have characteristic durations that increase with increasing temperature. For example, durations of operations of the sensing portion 430 may be affected by an increase in resistance with increased temperature, a reduction in transistor carrier mobility with increased temperature, or other phenomena, including examples as described herein. In some examples, sensing operations may be associated with a time constant behavior, where the time constant is longer at relatively higher temperatures and shorter at relatively lower temperatures. Accordingly, like the conditioning portion 410, operations of the sensing portion 430 may also be performed (e.g., initiated, triggered) according to a delay, duration, or other timing organization that is relatively longer at relatively higher temperatures, and relatively shorter at relatively lower temperatures.

In one example, the sensing portion 430 may have timing signals generated by PTAT delay components, associated with durations or delays that are proportional to a temperature of the memory device 110. For example, after initiating an operation with timing signal 436-a, a subsequent operation may be delayed by a duration for performing the operation that is proportional to temperature. In other words, a subsequent operation may be triggered or initiated after some characteristic delay, such as PTAT delay 435-a, that is proportional to temperature. Each operation of the sensing portion 430 may be triggered or initiated by a corresponding timing signal 436, and may be performed over a corresponding PTAT delay 435 that is configured to allow the operation to complete, or to be completed within some threshold amount of completion that supports the read operation associated with the timing sequence 400.

By using PTAT delays 435, or other delays that increase in response to increasing temperatures and decrease in response to decreasing temperatures, the timing sequence 400 may support a reduction in variation of the operations of the sensing portion 430 that might otherwise result from different operating temperatures of an associated memory device 110, and otherwise manage the overall duration of the timing sequence 400. For example, increasing delays of the sensing portion 430 at relatively higher temperatures may support operational durations of the sensing portion 430 tracking characteristic time constant behavior more closely, thereby reducing variations of such operations due to temperature variations.

Although the timing sequence 400 is illustrated as a read operation that concludes with a sensing portion 430, a read operation may also include, or be followed by a rewrite operation. For example, in some access schemes, a logic state stored at a memory cell 205 may be lost or degraded as a result of the read operation and, in some examples, a stored logic state may be rewritten to the same memory cell 205, or some other memory cell 205 (e.g., in a wear leveling operation, in an address remapping operation). In some examples, a rewrite operation may include aspects of write operation. For example, a write or rewrite operation may include initiating a charge transfer (e.g., according to a voltage 315 or a voltage 325, as described with reference to FIG. 3A), or initiating some or other change in physical state (e.g., charge state, polarization state, material state, atomic distribution, compositional distribution) of a storage element to store a logic state to a memory cell 205. In various memory architectures, portions of a write or rewrite operation may be associated with durations that are positively or negatively correlated with temperature, and accordingly, such portions may be associated with PTAT delays, CTAT delays, or other delays that allow durations for performing portions of write or rewrite operation to track characteristic changes of such portions that are related to temperature.

Figure 5A:
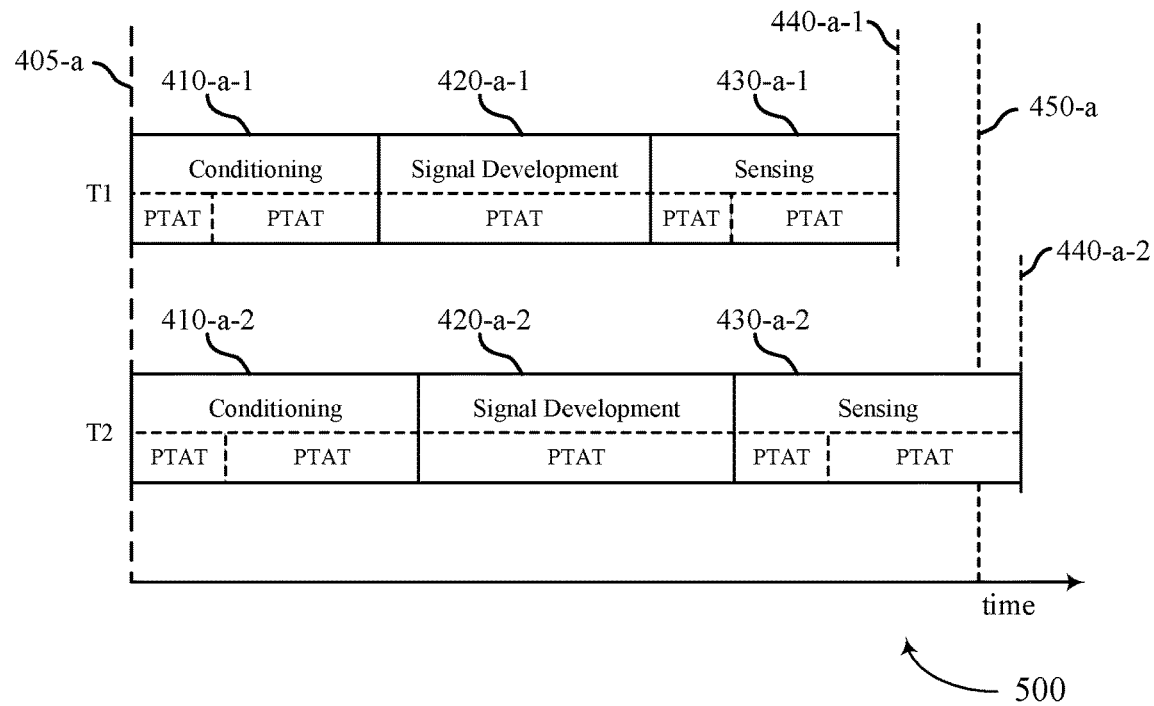
FIGS. 5A and 5B illustrate examples of timing sequences that support temperature-based access timing for a memory device in accordance with examples as disclosed herein.
Figure 5B:
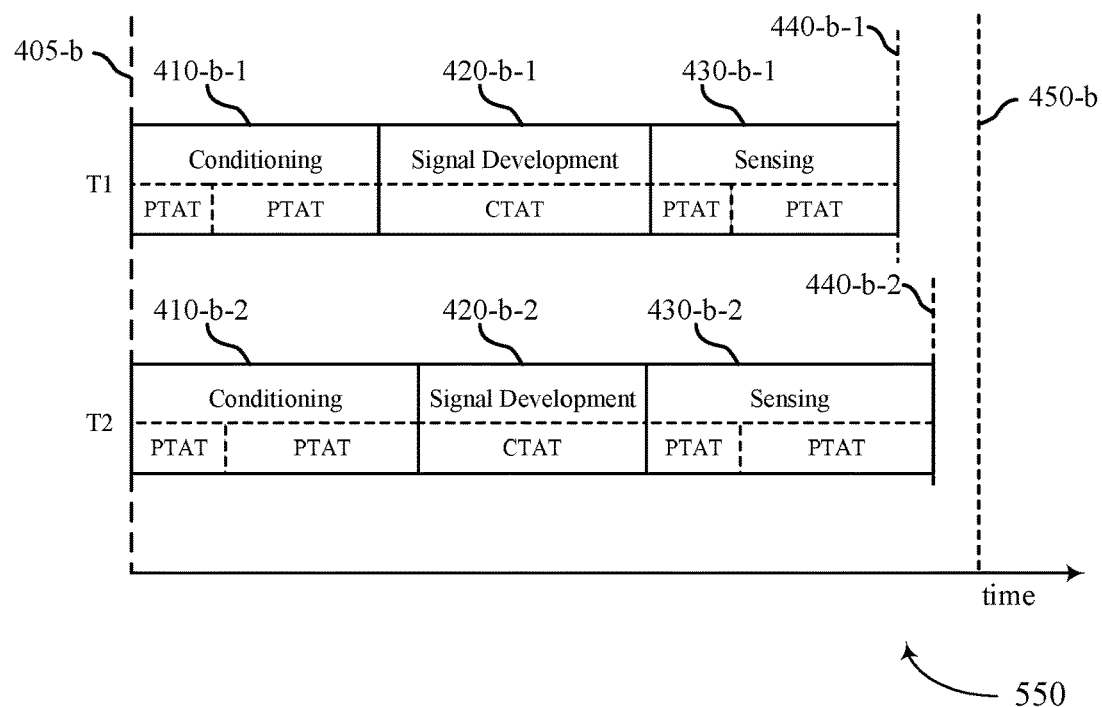

FIGS. 5A and 5B illustrate examples of timing sequences 500 and 550, respectively, that support temperature-based access timing for a memory device in accordance with examples as disclosed herein. Each of the timing sequences 500 and 550 may illustrate a read operation performed at a first temperature, T1, and at a second temperature, T2, that is greater than the first temperature. Each of the illustrated read operations may include a respective conditioning portion 410, a respective signal development portion 420, and a respective sensing portion 430, which may be examples of the corresponding portions described with reference to FIG. 4. Each of the read operations may begin at a respective time 405 and end at respective time 440, and may each be associated with an overall time window (e.g., an allocated time, a specified time) that concludes at time 450.

FIG. 5A illustrates a timing sequence 500 corresponding to a read operation that uses only PTAT delays (e.g., no CTAT delays). For example, each of the conditioning portions 410-a, the signal development portions 420-a, and the sensing portions 430-a include signal timing or other operational triggering or initiation that is associated with durations that are proportional to temperature. Accordingly, each of the durations of the timing sequence 500 are positively correlated with temperature.

As illustrated in the timing sequence 500, the read operation performed at the first temperature, T1, ends at a time 440-a-1, which is before the end of the overall allocated time (e.g., prior to 450-a). However, the read operation performed at the second temperature, T2, ends at a time 440-a-2, which is after the end of the overall allocated time (e.g., after to 450-a). Thus, the timing sequence 500 illustrates an example where using operational durations that are proportional to or otherwise positively correlated with temperature may cause the read operation to exceed an allocated time for performing the read operation under some circumstances (e.g., exceeding tRCD). According to these and other examples, using durations that are positively correlated with temperature may, in various circumstances, cause operations of a memory device 110 to fall outside a specification, or may involve relatively larger margins against time-dependent specifications, or may involve specifications (e.g., access rates) that vary at different temperatures. Although illustrated as a read operation having all PTAT delays, similar considerations may be applicable for read operations that have a combination of durations with PTAT delays and delays or durations that are not dependent on temperature.

FIG. 5B illustrates a timing sequence 550 corresponding to a read operation that uses a combination of PTAT and CTAT delays. For example, each of the conditioning portions 410-b and the sensing portions 430-b include signal timing or other operational triggering or initiation that is associated with durations that are proportional to temperature, and each of the signal development portions 420-a include signal timing or other operational triggering or initiation that is associated with durations that are inversely proportional to temperature. Accordingly, some of the durations of the timing sequence 500 are positively correlated with temperature, and some of the durations of the timing sequence 500 are negatively correlated with temperature.

As illustrated in the timing sequence 550, the read operation performed at the first temperature, T1, ends at a time 440-b-1, which is before the end of the overall allocated time (e.g., before 450-b). Moreover, the read operation performed at the second temperature, T2, ends at a time 440-b-2, which is also before the end of the overall allocated time (e.g., before to 450-b). Thus, the timing sequence 550 illustrates an example where using some operational durations that positively correlated with temperature and some operational durations that are negatively correlated with temperature may support a read operation falling within a specification across a broader range of temperatures, or otherwise having a smaller variance in overall duration relative to temperature variations. According to these and other examples, using some durations that are positively correlated with temperature and some durations that are negatively correlated with temperature may, in various circumstances, support operations of a memory device 110 falling within a specification over wider operating conditions, or may involve relatively smaller margins against time-dependent specifications. In some examples, such techniques may support leveraging circumstances where certain operations occur more quickly at higher temperatures to reduce overall time (e.g., using CTAT delays and PTAT delays to at least partially offset one another), or otherwise manage an amount of temperature-related increase.

Figure 6:
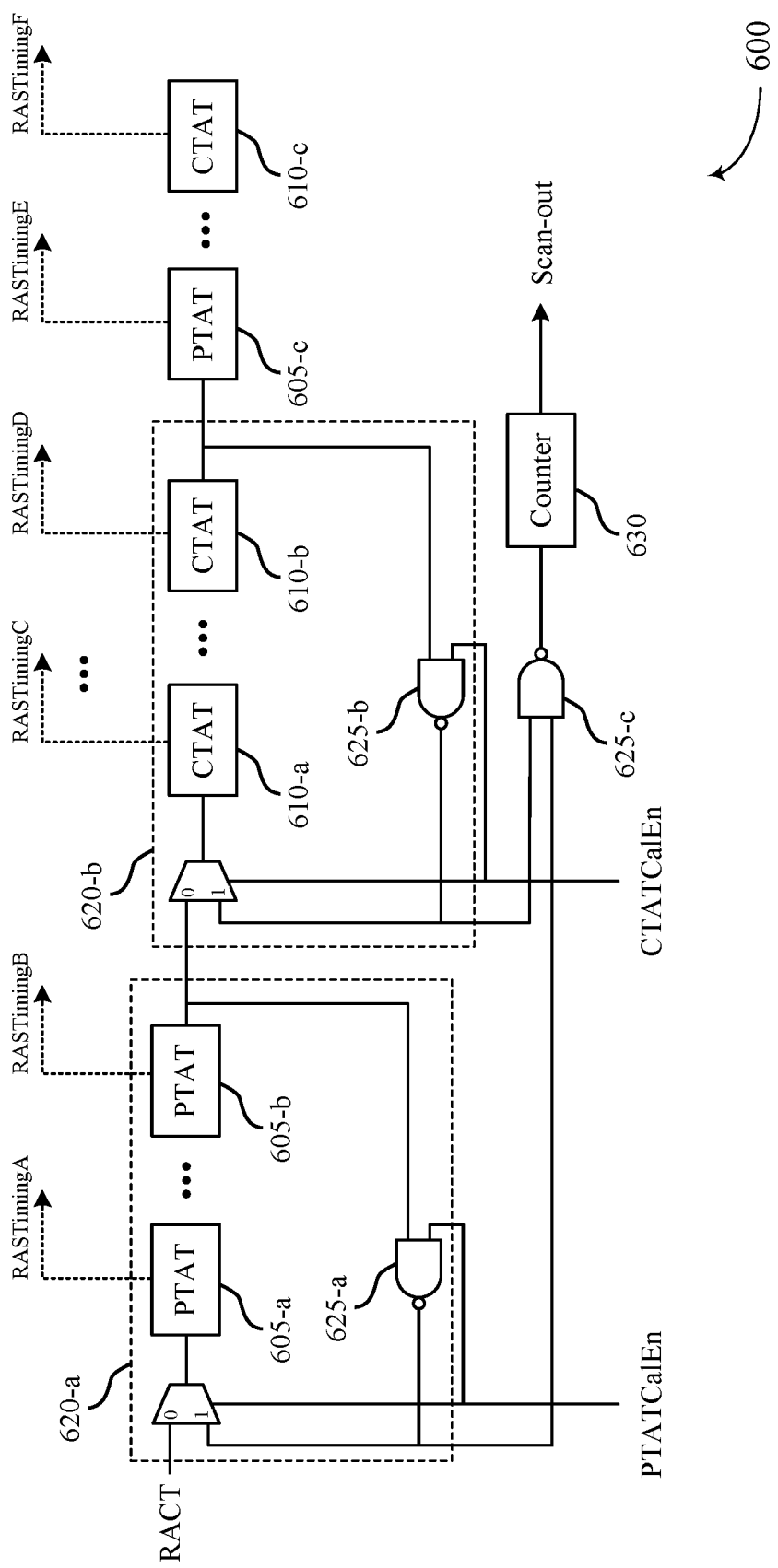
FIG. 6 illustrates an example of a delay chain that supports temperature-based access timing for a memory device in accordance with examples as disclosed herein

FIG. 6 illustrates an example of a delay chain 600 that supports temperature-based access timing for a memory device in accordance with examples as disclosed herein. At least a portion of the delay chain 600 may be a component of a memory device 110, such as a component of a device memory controller 155, a local memory controller 165, or a local memory controller 265. The delay chain 600 may include PTAT delay components 605 and CTAT delay components 610, which may each be associated with generating a timing signal (e.g., RASTimingA through RASTimingF, row address strobe (RAS) signals). In some examples, the generated timing signals may be associated with core timing signals of a memory die 200, such as timing signals 416, timing signals 426, or timing signals 436 described with reference to FIG. 4. In some examples, the collective quantity of PTAT delay components 605 and CTAT delay components 610 may correspond to a quantity of sub-operations of an access operation supported by the delay chain 600. In some examples, a memory device 110 may include multiple versions of the delay chain 600, each configured for a respective type of access operation. Additionally or alternatively, duplicates of the delay chain 600 may be distributed across portions of the memory device 110 (e.g., memory dies 160, memory dies 200) to support access operations on different portions of the memory device 110.

In some examples, delays of the delay chain 600 (e.g., delays or durations associated with the PTAT delay elements, delays or durations of the CTAT delay elements) may vary according to part-to-part or component-to-component process or manufacturing variations of a given memory device 110, or according to operating conditions of a memory device 110 (e.g., operating voltage, operating temperature), or some combination thereof, which may be referred to as PVT variation. Thus, although PTAT and CTAT delays may be manufactured with a default setting or configuration, in some examples, PTAT and CTAT delays may be calibrated (e.g., as a device-level calibration, as a die-level calibration, as a delay component-level calibration) to account for process and operating condition variations, and thereby mitigating delay or other timing signal degradation or variation.

In one example for supporting delay calibration of timing signals, the delay chain 600 may include circuitry operable to calibrate delays associated with the PTAT delay components 605 and the CTAT delay components 610. For example, PTAT delay components 605-a and 605-b may be arranged in a ring oscillator 620-a, supported by the NAND gate 625-a. When enabled by a signal PTATCalEn, the ring oscillator 620-a may oscillate between a high state and a low state (e.g., including an oscillation of an output of the NAND gate 625-a) at a frequency that is based at least in part on characteristic delays or durations of the PTAT delay components 605-a and 605-b. Additionally or alternatively, CTAT delay components 610-a and 610-b may be arranged in a ring oscillator 620-b, supported by the NAND gate 625-b. When enabled by a signal CTATCalEn, the ring oscillator 620-b may oscillate between a high state and a low state (e.g., including an oscillation of an output of the NAND gate 625-b) at a frequency that is based at least in part on characteristic delays or durations of the CTAT delay components 610-a and 610-b.

To support various calibration operations, the ring oscillator 620-a and the ring oscillator 620-b may be selectively enabled generate an oscillating signal, where the oscillating signal may be separately enabled for PTAT delay calibration (e.g., by enabling the PTATCalEn signal) or CTAT delay calibration (e.g., by enabling the CTATCalEn signal). In some examples, the delay chain 600 may be provided with or otherwise coupled with a voltage source of a memory device 110, or a memory die 200, or some otherwise regulated voltage supply, such that calibration of the delay chain 600 (e.g., operation of the ring oscillators 620) and corresponding timing signals may be performed in a manner that accounts for voltage variability (e.g., part-to-part voltage variability, die-to-die voltage variability, component-to-component variability). In various examples, PTATCalEn and CTATCalEn may be provided by a memory device 110 that includes the delay chain 600, may be commanded by a calibration device or host device in communication with the delay chain 600, or may be provided directly from a calibration device or host device in communication with the delay chain 600.

In some examples for calibrating timing signals, a target duration for an access operation, or some portion thereof, may be known for a particular condition (e.g., temperature). Thus, the delay chain 600, or a memory die 200 or memory device 110 that includes the delay chain 600, may be taken to the particular condition during a calibration operation (e.g., taken to a calibration temperature). In other examples, the calibration operation may be responsive to an actual condition of the delay chain 600, or a memory die 200 or memory device 110 that includes the delay chain 600, and the calibration operation may include determining a target duration for an access operation, or portion thereof, based on an observed condition (e.g., temperature) when performing the calibration operation. The target duration may be compared to a behavior of a respective ring oscillator 620, or combination thereof, which may include a direct comparison of durations (e.g., duration for completing a single oscillation or some quantity of oscillations to the target duration of some multiple or fraction of the target duration), or some other comparison (e.g., a comparison of oscillation frequency of a ring oscillator 620 and a frequency corresponding to the target duration).

To calibrate PTAT delay components 605, the ring oscillator 620-a may be enabled (e.g., enabling PTATCalEn), and a duration between counts, or a frequency or quantity of counts, may be observed via the Scan-out of the counter 630. If the frequency of oscillation or other corresponding behavior of the ring oscillator 620-a is found to be too slow, characteristic delays of one or more of the PTAT delay components 605 may be shortened. If the frequency of oscillation or other corresponding behavior of the ring oscillator 620-a is found to be too fast, characteristic delays of one or more of the PTAT delay components 605 may be lengthened. In some examples, such an approach may assume that an as-built or as-provided temperature dependence (e.g., a configured proportionality constant or other positive correlation characteristic) of the PTAT delay components 605 is acceptable, which may support a single-point calibration of the PTAT delay components 605. In some examples, such an approach may be performed at two or more operating conditions (e.g., two or more temperatures), which may support evaluating a temperature dependence of the PTAT delay components 605. An evaluated temperature dependence of PTAT delay components 605 may be compared to a characteristic temperature dependence of various portions of an access operation (e.g., related to temperature dependence of resistance, related to temperature dependence of carrier mobility), and a calibration operation may include adjusting or otherwise configuring a variable temperature dependence of one or more PTAT delay components 605 (e.g., configuring a proportionality constant). Although the calibration using the ring oscillator 620-a may be directly applicable to the calibration of one or more of PTAT delay components 605 included in the ring oscillator 620-a, the results of such a calibration operation may be applied to other PTAT delays outside the ring oscillator 620-a (e.g., PTAT delay component 605-c).

To calibrate CTAT delay components 610, the ring oscillator 620-b may be enabled (e.g., enabling CTATCalEn), and a duration between counts, or a frequency or quantity of counts, may be observed via the Scan-out of the counter 630. If the frequency of oscillation or other corresponding behavior of the ring oscillator 620-b is found to be too slow, characteristic delays of one or more of the CTAT delay components 610 may be shortened. If the frequency of oscillation or other corresponding behavior of the ring oscillator 620-b is found to be too fast, characteristic delays of one or more of the CTAT delay components 610 may be lengthened. In some examples, such an approach may assume that an as-built or as-provided temperature dependence (e.g., a configured proportionality constant or other positive correlation characteristic) of the CTAT delay components 610 is acceptable, which may support a single-point calibration of the CTAT delay components 610. In some examples, such an approach may be performed at two or more operating conditions (e.g., two or more temperatures), which may support evaluating a temperature dependence of the CTAT delay components 610. An evaluated temperature dependence of CTAT delay components 610 may be compared to a characteristic temperature dependence of various portions of an access operation (e.g., related to temperature dependence of a saturation polarization characteristic, recoil characteristic, or coercivity of a ferroelectric capacitor 240, or other temperature dependence of accessing a memory cell 205), and a calibration operation may include adjusting or otherwise configuring a variable temperature dependence of one or more CTAT delay components 610 (e.g., configuring an inverse proportionality constant). Although the calibration using the ring oscillator 620-b may be directly applicable to the calibration of one or more of CTAT delay components 610 included in the ring oscillator 620-b, the results of such a calibration operation may be applied to other CTAT delay components outside the ring oscillator 620-b (e.g., CTAT delay component 610-c).

The calibration of the delay chain 600 for providing timing signals may include various settings and configurations applicable to PTAT delay components 605 and CTAT delay components 610. In some examples, setting a configuration for a PTAT delay component 605 or a CTAT delay component 610 may include setting a fuse or an anti-fuse (e.g., of a memory device 110, of a memory die 200), which may selectively enable or disable various circuitry coupled with or included in a respective PTAT delay component 605 or CTAT delay component 610. In some examples, setting a configuration for a PTAT delay component 605 or a CTAT delay component 610 may include configuring a variable slope of an electrical characteristic for circuitry coupled with or included in a respective PTAT delay component 605 or CTAT delay component 610. In some examples, setting a configuration for a PTAT delay component 605 or a CTAT delay component 610 may include configuring a variable capacitance coupled with or included in a respective PTAT delay component 605 or CTAT delay component 610. In some examples, setting a configuration for a PTAT delay component 605 or a CTAT delay component 610 may include configuring a variable diode over resistor coupled with or included in a respective PTAT delay component 605 or CTAT delay component 610. In some examples, setting a configuration for a PTAT delay component 605 or a CTAT delay component 610 may include configuring a logic threshold of a component coupled with or included in a respective PTAT delay component 605 or CTAT delay component 610. In some examples, the counter 630 may be used to support access signal timing, and setting a configuration for duration or delay in timing signals may include configuring a respective count value associated with triggering or initiating a portion of an access operation, which may correspond to a quantity of oscillations of a ring oscillator 620.

Figure 7:
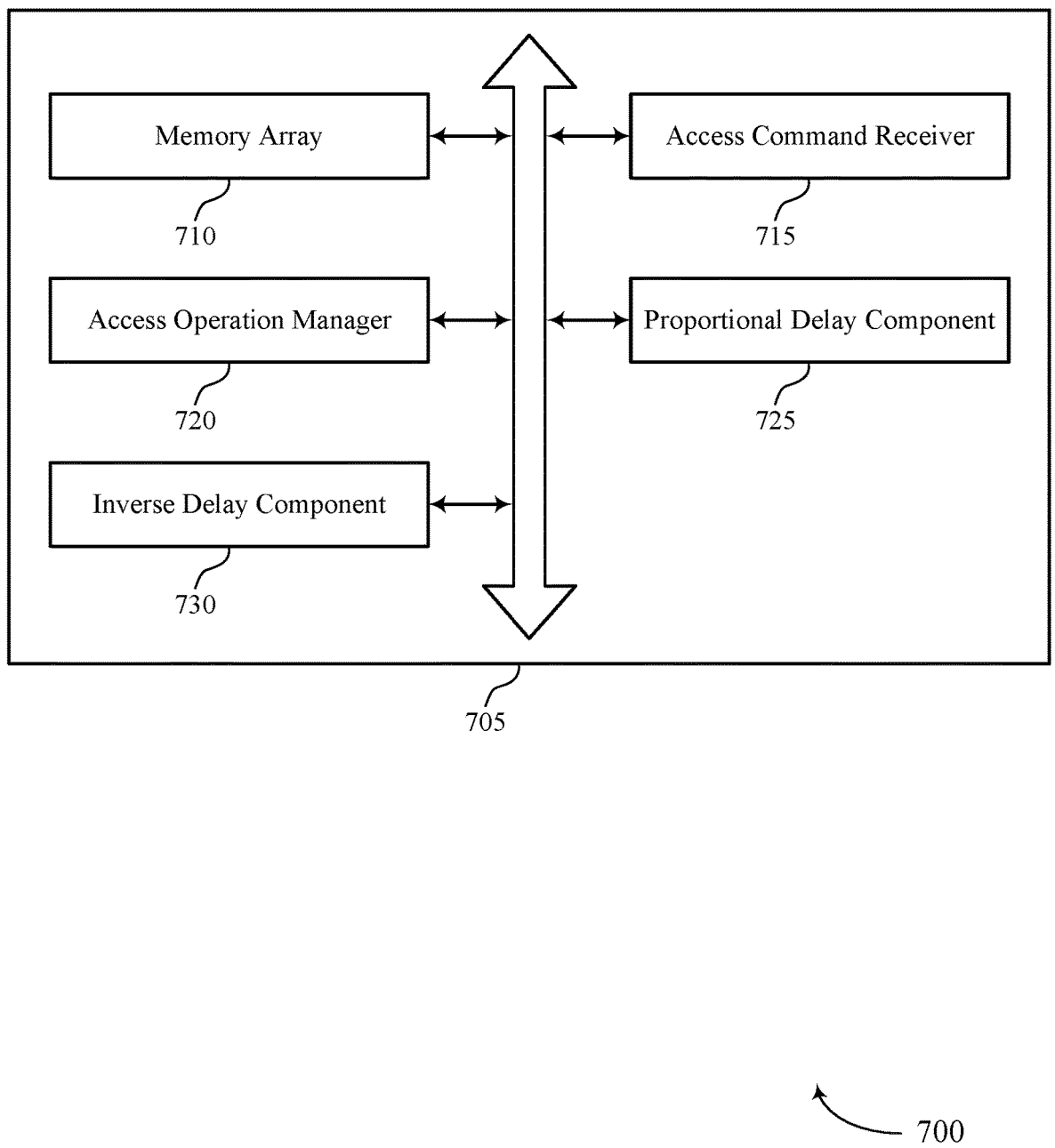
FIG. 7 shows a block diagram of a memory device that supports temperature-based access timing for a memory device in accordance with aspects of the present disclosure.

FIG. 7 shows a block diagram 700 of a memory device 705 that supports temperature-based access timing for a memory device in accordance with examples as disclosed herein. The memory device 705 may be an example of aspects of a memory device as described with reference to FIGS. 1 through 6]. The memory device 705 may include a memory array 710, an access command receiver 715, an access operation manager 720, a proportional delay component 725, and an inverse delay component 730. Each of these modules may communicate, directly or indirectly, with one another (e.g., via one or more buses).

The memory array 710 may be an example of a memory array as disclosed herein (e.g., a memory array 170 described with reference to FIG. 1). The memory array 710 may include a plurality of memory cells 205, which may include capacitive storage elements, ferroelectric storage elements, material memory elements, storage elements of other memory architectures.

The access command receiver 715 may receive an access command at the memory device 705. In various examples, the access command or associated access operations may be associated with a read command, a write command, a rewrite command, a refresh command, or any other memory access command.

The access operation manager 720 may perform an access operation in response to a received access command. In some examples, performing the access operation includes performing a first set of one or more operations each associated with a respective duration that is proportional to a temperature of the memory device 705 (e.g., as controlled or otherwise supported by the proportional delay component 725). In various examples, the first set of operations may include a row opening operation, a digit line precharge operation, a cell selection operation, a digit line selection operation, a sensing operation, a latching operation, or various combinations thereof.

In some examples, performing the access operation includes performing a second set of one or more operations each associated with a respective duration that is inversely proportional to the temperature of the memory device 705 (e.g., as controlled or otherwise supported by the proportional delay component 725). In some examples, the second set of operations may include performing a signal development operation that includes a charge transfer or exchange between a memory cell of the memory array 710 and an access line of the memory array 710. In some examples, the second set of operations may include initiating a charge transfer between a ferroelectric capacitor of a memory cell and an access line.

In some examples, the proportional delay component 725 may generate a first signal configured to introduce a first delay that is proportional to the temperature of the memory device 705.

In some examples, the inverse delay component 730 may generate a second signal configured to introduce a second delay that is inversely proportional to the temperature of the memory device 705.

Figure 8:
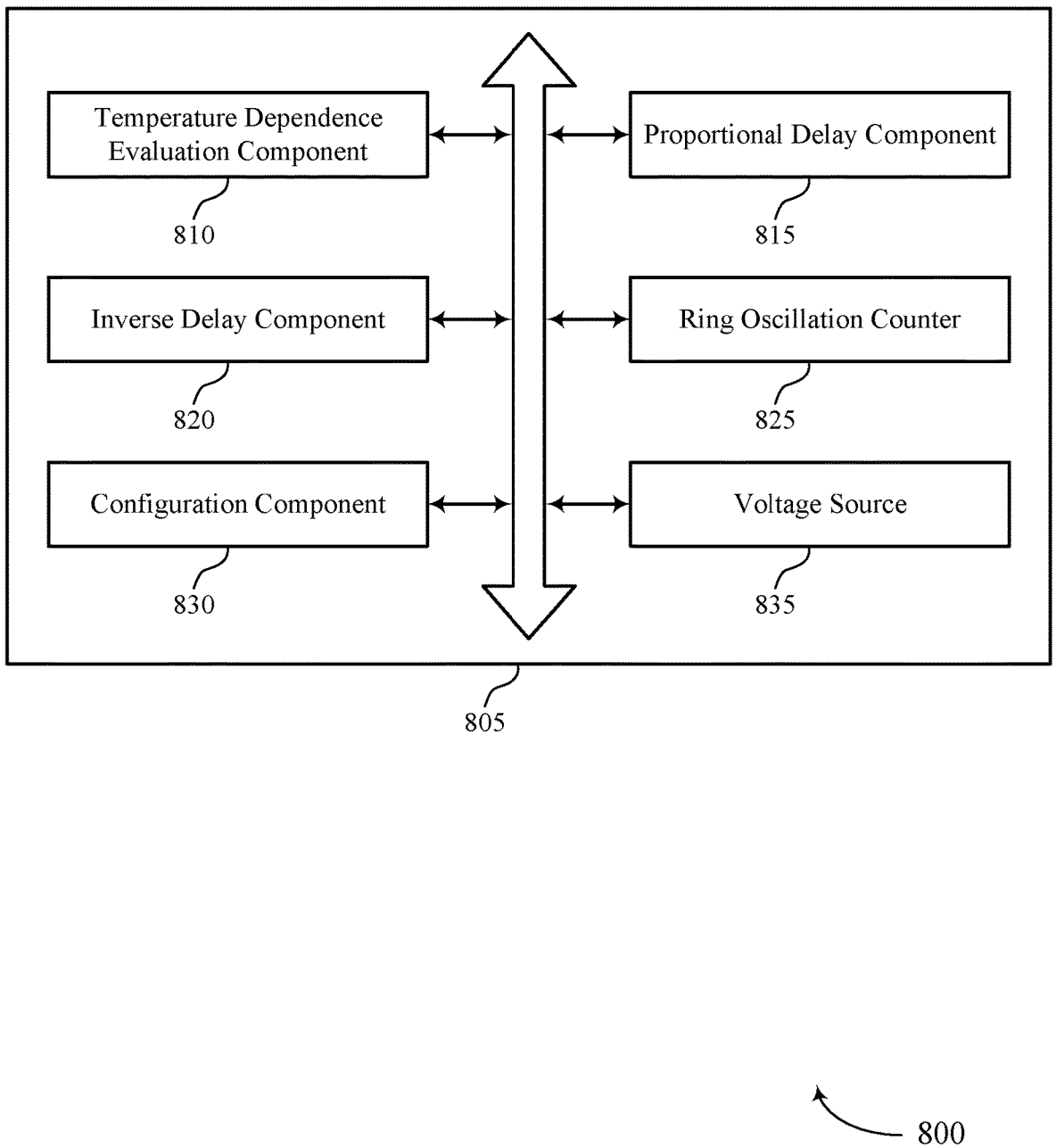
FIG. 8 shows a block diagram of a memory device or associated calibration device that supports temperature-based access timing for a memory device in accordance with aspects of the present disclosure.

FIG. 8 shows a block diagram 800 of a memory device 805, or associated calibration device, that supports temperature-based access timing for a memory device in accordance with examples as disclosed herein. The memory device 805 or associated calibration device may be an example of or otherwise refer to aspects of a memory device as described with reference to FIGS. 1 through 7. The memory device 805 or associated calibration device may include a temperature dependence evaluation component 810, a proportional delay component 815, an inverse delay component 820, a ring oscillation counter 825, a configuration component 830, and a voltage source 835. Each of these modules may communicate, directly or indirectly, with one another (e.g., via one or more buses).

The temperature dependence evaluation component 810 may measure, at a memory device, a first temperature dependence of a first portion of an access operation to access a memory cell of the memory device.

In some examples, the temperature dependence evaluation component 810 may measure, at the memory device, a second temperature dependence of a second portion of the access operation to access the memory cell of the memory device.

The proportional delay component 815 may set or include a configuration for a first delay component of the memory device based on the first temperature dependence. In some examples, the first delay component may be configured to cause a portion of an access operation to have a first duration that is proportional to a temperature of the memory device.

The inverse delay component 820 may set or include a configuration for a second delay component of the memory device based on the second temperature dependence. In some examples, the second delay component may be configured to cause a portion of the access operation to have a second duration that is inversely proportional to the temperature of the memory device.

In some examples, to set or include the configuration for the first delay component, the ring oscillation counter 825 may set or include a first count value corresponding to a first quantity of cycles by a ring oscillator of the memory device.

In some examples, to set or include the configuration for the second delay component, the ring oscillation counter 825 may set or include a second count value corresponding to a second quantity of cycles by the ring oscillator of the memory device.

In some examples, to set the configuration for the first delay component or to set the configuration for the second delay component, the configuration component 830 may set a fuse or an anti-fuse associated with the memory device.

In some examples, to set the configuration for the first delay component or to set the configuration for the second delay component, the configuration component 830 may configure a variable slope of an electrical characteristic for circuitry of the memory device.

In some examples, to set the configuration for the first delay component or to set the configuration for the second delay component, the configuration component 830 may configure a variable capacitance of a component of the memory device.

In some examples, to set the configuration for the first delay component or to set the configuration for the second delay component, the configuration component 830 may configure a variable diode over resistor included in the memory device.

In some examples, to set the configuration for the first delay component or to set the configuration for the second delay component, the configuration component 830 may configure a logic threshold of a component of the memory device.

In some examples, to set the configuration for the first delay component or to set the configuration for the second delay component, the configuration component 830 may set a configuration that is based at least in part on a voltage level of a voltage source associated with the memory device (e.g., voltage source 835).

Figure 9:
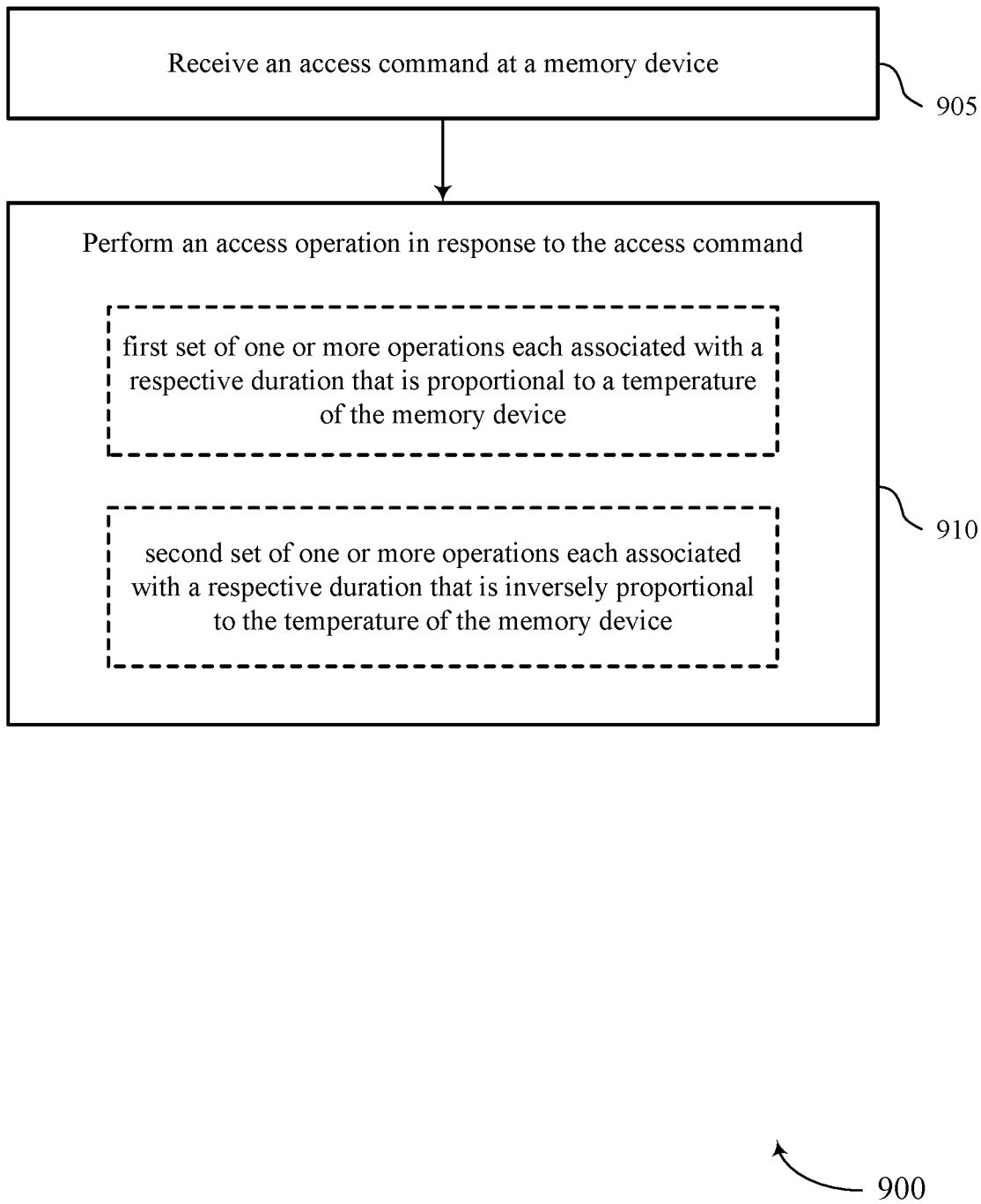
FIGS. 9 and 10 show flowcharts illustrating a method or methods that support temperature-based access timing for a memory device in accordance with examples as disclosed herein.

FIG. 9 shows a flowchart illustrating a method or methods 900 that supports temperature-based access timing for a memory device in accordance with aspects of the present disclosure. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may receive an access command at a memory device. The operations of 905 may be performed according to the methods described herein. In some examples, aspects of the operations of 905 may be performed by an access command receiver as described with reference to FIG. 7.

At 910, the memory device may perform an access operation in response to the access command. The access operation may include a first set of one or more operations each associated with a respective duration that is proportional to a temperature of the memory device, and a second set of one or more operations each associated with a respective duration that is inversely proportional to the temperature of the memory device. The operations of 910 may be performed according to the methods described herein. In some examples, aspects of the operations of 910 may be performed by an access operation manager as described with reference to FIG. 7.

In some examples, an apparatus as described herein may perform a method or methods, such as the method 900. The apparatus may include features, circuitry, means, or instructions (e.g., a non-transitory computer-readable medium storing instructions executable by a processor) for receiving an access command at a memory device and performing an access operation in response to the access command. The access operation may include a first set of one or more operations each associated with a respective duration that is proportional to a temperature of the memory device, and a second set of one or more operations each associated with a respective duration that is inversely proportional to the temperature of the memory device.

In some examples of the method 900 and the apparatus described herein, performing the first set of one or more operations may include operations, features, circuitry, means, or instructions for generating a first signal using a first delay component, the first delay component configured to introduce a first delay that may be proportional to the temperature of the memory device.

In some examples of the method 900 and the apparatus described herein, performing the second set of one or more operations may include operations, features, circuitry, means, or instructions for generating a second signal using a second delay component, the second delay component configured to introduce a second delay that is inversely proportional to the temperature of the memory device.

In some examples of the method 900 and the apparatus described herein, performing the first set of one or more operations may include operations, features, circuitry, means, or instructions for performing a row opening operation, performing a digit line precharge operation, performing a cell selection operation, performing a digit line selection operation, or performing a sensing operation, performing a latching operation, or performing any combination thereof.

In some examples of the method 900 and the apparatus described herein, performing the second set of one or more operations may include operations, features, circuitry, means, or instructions for performing a signal development operation that includes a charge transfer between a memory cell and an access line. In some examples of the method 900 and the apparatus described herein, performing the signal development operation may include operations, features, circuitry, means, or instructions for initiating the charge transfer between a ferroelectric capacitor of the memory cell and the access line.

In some examples of the method 900 and the apparatus described herein, the access command includes a read command, or a write command, a rewrite command, or a refresh command.

Figure 10:
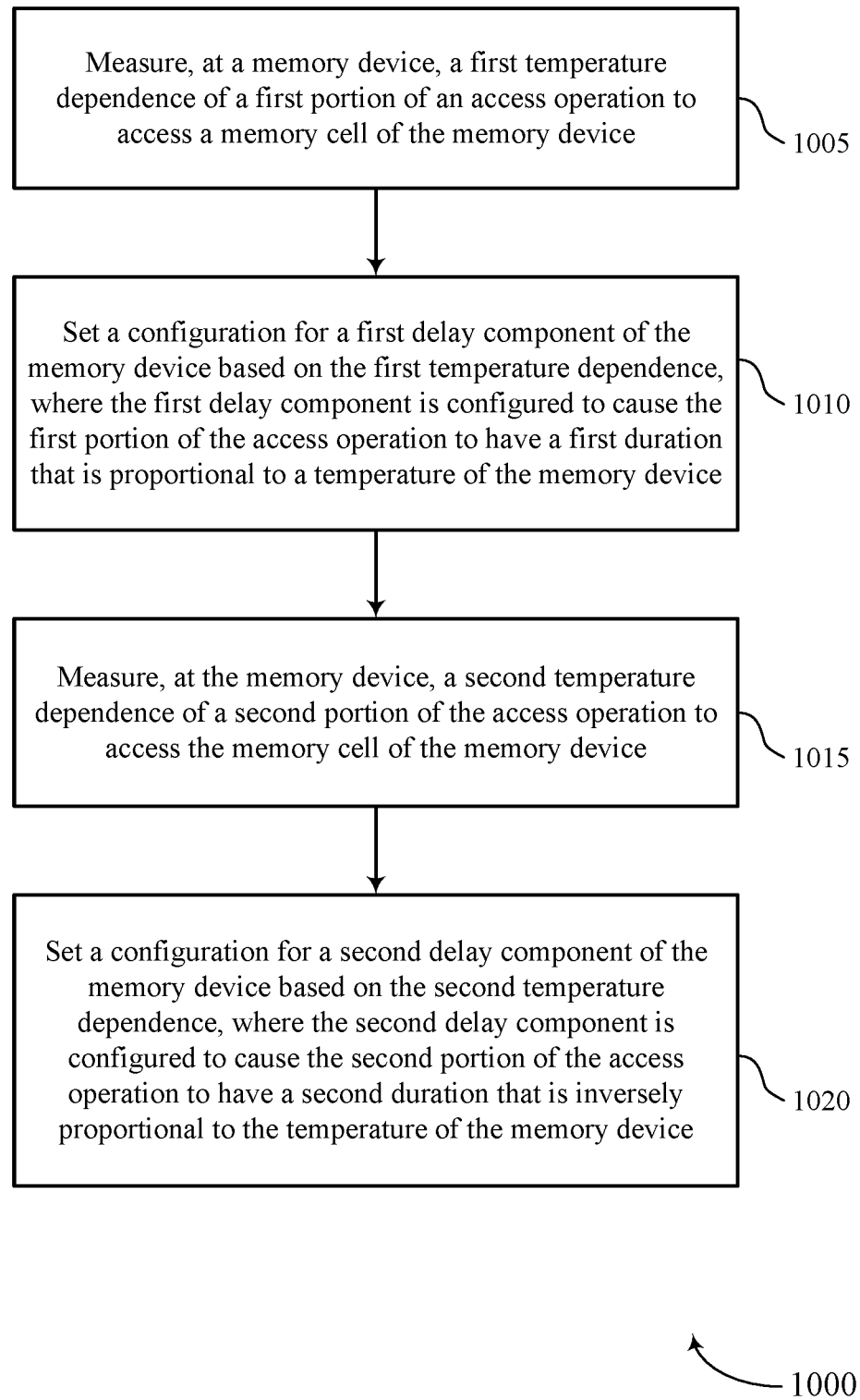

FIG. 10 shows a flowchart illustrating a method or methods 1000 that supports temperature-based access timing for a memory device in accordance with aspects of the present disclosure. The operations of method 1000 may be implemented by a memory device, or an associated calibration device, or its components as described herein. For example, the operations of method 1000 may be performed by a memory device or associated calibration device as described with reference to FIG. 8. In some examples, performing the method or methods 1000 may include executing a set of instructions to control the functional elements of the memory device or associated calibration device to perform the described functions. Additionally or alternatively, performing operations of the method or methods 1000 may include using special-purpose hardware.

At 1005, the method may include measuring, at a memory device, a first temperature dependence of a first portion of an access operation to access a memory cell of the memory device. The operations of 1005 may be performed according to the methods described herein. In some examples, aspects of the operations of 1005 may be performed by a temperature dependence evaluation component as described with reference to FIG. 8.

At 1010, the method may include setting a configuration for a first delay component of the memory device based on the first temperature dependence, where the first delay component is configured to cause the first portion of the access operation to have a first duration that is proportional to a temperature of the memory device. The operations of 1010 may be performed according to the methods described herein. In some examples, aspects of the operations of 1010 may be performed by a proportional delay component as described with reference to FIG. 8.

At 1015, method may include measuring, at the memory device, a second temperature dependence of a second portion of the access operation to access the memory cell of the memory device. The operations of 1015 may be performed according to the methods described herein. In some examples, aspects of the operations of 1015 may be performed by a temperature dependence evaluation component as described with reference to FIG. 8.

At 1020, the method may include setting a configuration for a second delay component of the memory device based on the second temperature dependence, where the second delay component is configured to cause the second portion of the access operation to have a second duration that is inversely proportional to the temperature of the memory device. The operations of 1020 may be performed according to the methods described herein. In some examples, aspects of the operations of 1020 may be performed by an inverse delay component as described with reference to FIG. 8.

In some examples, an apparatus as described herein may perform a method or methods, such as the method 1000. The apparatus may include features, circuitry, means, or instructions (e.g., a non-transitory computer-readable medium storing instructions executable by a processor) for measuring, at a memory device, a first temperature dependence of a first portion of an access operation to access a memory cell of the memory device, setting a configuration for a first delay component of the memory device based on the first temperature dependence, where the first delay component is configured to cause the first portion of the access operation to have a first duration that is proportional to a temperature of the memory device, measuring, at the memory device, a second temperature dependence of a second portion of the access operation to access the memory cell of the memory device, and setting a configuration for a second delay component of the memory device based on the second temperature dependence, where the second delay component is configured to cause the second portion of the access operation to have a second duration that is inversely proportional to the temperature of the memory device.

In some examples of the method 1000 and the apparatus described herein, setting the configuration for the first delay component may include operations, features, circuitry, means, or instructions for setting a first count value corresponding to a first quantity of cycles by a ring oscillator of the memory device, and setting the configuration for the second delay component may include operations, features, circuitry, means, or instructions for setting a second count value corresponding to a second quantity of cycles by the ring oscillator of the memory device.

In some examples of the method 1000 and the apparatus described herein, setting the configuration for the first delay component, setting the configuration for the second delay component, or both, may include operations, features, circuitry, means, or instructions for setting a fuse or an anti-fuse associated with the memory device.

In some examples of the method 1000 and the apparatus described herein, setting the configuration for the first delay component, setting the configuration for the second delay component, or both, may include operations, features, circuitry, means, or instructions for configuring a variable slope of an electrical characteristic for circuitry of the memory device.

In some examples of the method 1000 and the apparatus described herein, setting the configuration for the first delay component, setting the configuration for the second delay component, or both, may include operations, features, circuitry, means, or instructions for configuring a variable capacitance of a component of the memory device.

In some examples of the method 1000 and the apparatus described herein, setting the configuration for the first delay component, setting the configuration for the second delay component, or both, may include operations, features, circuitry, means, or instructions for configuring a variable diode over resistor included in the memory device.

In some examples of the method 1000 and the apparatus described herein, setting the configuration for the first delay component, setting the configuration for the second delay component, or both, may include operations, features, circuitry, means, or instructions for configuring a logic threshold of a component of the memory device.

Some examples of the method 1000 and the apparatus described herein may further include operations, features, circuitry, means, or instructions for setting the configuration for the first delay component, setting the configuration for the second delay component, or both, may be based on a voltage level of a voltage source associated with the memory device.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory cell, a receiver component configured to receive an access command for accessing the memory cell, a first delay component configured for performing a first operation, responsive to the access command, according to a first duration that is proportional to a temperature of the apparatus, and a second delay component configured for performing a second operation, responsive to the access command, according to a second duration that is inversely proportional to the temperature of the apparatus.

Some examples of the apparatus may include a ring oscillator, and the first delay component may be configured for performing the first operation according to a quantity of cycles of the ring oscillator. In some examples, the second delay component may be configured for performing the second operation according to a second quantity of cycles of the ring oscillator. In some examples, the ring oscillator may be configured to may have a rate of cycling that is proportional to the temperature of the apparatus.

Some examples of the apparatus may include a second ring oscillator, and the second delay component may be configured for performing the second operation according to a second quantity of cycles of the second ring oscillator. In some examples, the second ring oscillator may be configured to may have a rate of cycling that may be inversely proportional to the temperature of the apparatus.

In some examples, the first delay component, the second delay component, or both may include a variable capacitance that is configurable to generate an operational delay that is based on the temperature of the apparatus.

In some examples, the first delay component, the second delay component, or both may include a variable diode over resistor configurable to generate an operational delay that is based on the temperature of the apparatus.

In some examples, the first delay component, the second delay component, or both may include a variable logic threshold configurable to generate an operational delay that is based on the temperature of the apparatus.

In some examples, the memory cell includes a ferroelectric capacitor, or other storage component that has an operational characteristic or signal development characteristic that behaves according to a duration that is inversely proportional to temperature.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a memory device; and
a controller coupled with the memory device and operable to cause to the apparatus to:
receive an access command to perform an access operation;
perform a first set of one or more sub-operations of the access operation, each sub-operation of the first set initiated after a respective delay that is proportional to a temperature of the memory device; and
perform a second set of one or more sub-operations of the access operation, each sub-operation of the second set initiated after a respective delay that is inversely proportional to the temperature of the memory device.

2. The apparatus of claim 1, wherein to perform the first set of one or more sub-operations the controller is further operable to cause the apparatus to:
generate a first signal using a first delay component, the first delay component configured to introduce a first delay that is proportional to the temperature of the memory device.

3. The apparatus of claim 1, wherein to perform the second set of one or more sub-operations the controller is further operable to cause the apparatus to:
generate a second signal using a second delay component, the second delay component configured to introduce a second delay that is inversely proportional to the temperature of the memory device.

4. The apparatus of claim 1, wherein to perform the first set of one or more sub-operations the controller is further operable to cause the apparatus to:

perform a row opening operation, a digit line precharge operation, a cell selection operation, a digit line selection operation, a sensing operation, a latching operation, or any combination thereof.

5. The apparatus of claim 1, wherein to perform the second set of one or more sub-operations the controller is further operable to cause the apparatus to:
perform a signal development operation that comprises a charge transfer between a memory cell and an access line.

6. The apparatus of claim 5, wherein to perform the signal development operation the controller is further operable to cause the apparatus to:
initiating the charge transfer between a ferroelectric capacitor of the memory cell and the access line.

7. The apparatus of claim 1, further comprising:
a set of first delay components each configured to introduce a first delay that is proportional to the temperature of the memory device, wherein a quantity of first delay components of the set of first delay components corresponds to a quantity of sub-operations of the first set of one or more sub-operations.

8. The apparatus of claim 1, further comprising:
a set of second delay components each configured to introduce a second delay that is inversely proportional to the temperature of the memory device, wherein a quantity of second delay components of the set of second delay components corresponds to a quantity of sub-operations of the second set of one or more sub-operations.

9. An apparatus, comprising:
a memory cell; and
a controller coupled with the memory cell and operable to cause the apparatus to:
receive a command to perform an access operation on the memory cell;
delay, by a first delay component, a first sub-operation of the access operation according to a first duration that is proportional to a temperature of the apparatus; and
delay, by a second delay component, a second sub-operation of the access operation according to a second duration that is inversely proportional to the temperature of the apparatus.

10. The apparatus of claim 9, wherein the controller is further operable to cause the apparatus to:
delay, by the first delay component, the first sub-operation of the access operation based at least in part on a quantity of cycles of a ring oscillator.

11. The apparatus of claim 10, wherein the controller is further operable to cause the apparatus to:
delay, by the second delay component, the second sub-operation of the access operation based at least in part on a second quantity of cycles of the ring oscillator.

12. The apparatus of claim 10, wherein the ring oscillator is configured to have a rate of cycling that is proportional to the temperature of the apparatus.

13. The apparatus of claim 10, wherein the controller is further operable to cause the apparatus to:
delay, by the second delay component, the second sub-operation of the access operation based at least in part on a second quantity of cycles of a second ring oscillator.

14. The apparatus of claim 13, wherein the second ring oscillator is configured to have a rate of cycling that is inversely proportional to the temperature of the apparatus.

15. The apparatus of claim 9, wherein the first delay component, the second delay component, or both, have a variable capacitance that is configurable to generate an operational delay that is based at least in part on the temperature of the apparatus.

16. The apparatus of claim 9, wherein the first delay component, the second delay component, or both, comprise:
a variable diode over resistor configurable to generate an operational delay that is based at least in part on the temperature of the apparatus.

17. The apparatus of claim 9, wherein the first delay component, the second delay component, or both, comprise:
a variable logic threshold configurable to generate an operational delay that is based at least in part on the temperature of the apparatus.

18. A method, comprising:
configuring, based at least in part on a first temperature dependence of a first portion of an access operation, a first delay component of a memory device to delay the first portion of the access operation according to a first duration that is proportional to a temperature of the memory device; and
configuring, based at least in part on a second temperature dependence of a second portion of the access operation, a second delay component of the memory device to delay the second portion of the access operation according to a second duration that is inversely proportional to the temperature of the memory device, wherein the second portion of the access operation is different from the first portion of the access operation.

19. The method of claim 18, further comprising:
comparing the first temperature dependence of the first portion of the access operation to a third temperature dependence of the first delay component, wherein configuring the first delay component comprises:
configuring a proportionality constant of the first delay component based at least in part on the comparison.

20. The method of claim 18, further comprising:
comparing the second temperature dependence of the second portion of the access operation to a third temperature dependence of the second delay component, wherein configuring the second delay component comprises:
configuring an inverse proportionality constant of the second delay component based at least in part on the comparison.

* * * * *